US011600536B2

(12) United States Patent
Okuyama et al.

(10) Patent No.: US 11,600,536 B2
(45) Date of Patent: Mar. 7, 2023

(54) DIMENSION MEASUREMENT APPARATUS, DIMENSION MEASUREMENT PROGRAM, AND SEMICONDUCTOR MANUFACTURING SYSTEM

(71) Applicant: Hitachi High-Tech Corporation, Tokyo (JP)

(72) Inventors: Yutaka Okuyama, Tokyo (JP); Takeshi Ohmori, Tokyo (JP); Yasutaka Toyoda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/957,480

(22) PCT Filed: Jul. 4, 2019

(86) PCT No.: PCT/JP2019/026595
§ 371 (c)(1),
(2) Date: Jun. 24, 2020

(87) PCT Pub. No.: WO2020/121564
PCT Pub. Date: Jun. 18, 2020

(65) Prior Publication Data
US 2022/0139788 A1    May 5, 2022

(51) Int. Cl.
*H01L 21/66* (2006.01)
*H01J 37/26* (2006.01)
(Continued)

(52) U.S. Cl.
CPC .............. *H01L 22/12* (2013.01); *G01B 21/00* (2013.01); *G05B 19/048* (2013.01); (Continued)

(58) Field of Classification Search
None
See application file for complete search history.

(56) References Cited

U.S. PATENT DOCUMENTS 7,910,885 B2 *   3/2011   Rosenberg ......... G01N 23/2251
                                                   250/306
2002/0181776 A1   12/2002  Ikku
(Continued)

FOREIGN PATENT DOCUMENTS

JP    2002-350127 A    12/2002
JP    2009-206453 A     9/2009
(Continued)

OTHER PUBLICATIONS

Search Report dated Oct. 1, 2019 in International Application No. PCT/JP2019/026595.

*Primary Examiner* — Brent A. Fairbanks
(74) *Attorney, Agent, or Firm* — Miles & Stockbridge, P.C.

(57) ABSTRACT

The disclosure relates to a dimension measurement apparatus that reduces time required for dimension measurement and eliminates errors caused by an operator. Therefore, the dimension measurement apparatus uses a first image recognition model that extracts a boundary line between a processed structure and a background over the entire cross-sectional image and/or a boundary line of an interface between different kinds of materials, and a second image recognition that output information for dividing the boundary line extending over the entire cross-sectional image obtained from the first image recognition model for each unit pattern constituting a repetitive pattern, obtains coordinates of a plurality of feature points defined in advance for each unit pattern, and measures a dimension defined as a distance between two predetermined points of the plurality of feature points.

20 Claims, 26 Drawing Sheets

(51) Int. Cl.
*G05B 19/048* (2006.01)
*H01L 21/67* (2006.01)
*G01B 21/00* (2006.01)
*G06N 20/00* (2019.01)

(52) U.S. Cl.
CPC ........ H01L 21/67276 (2013.01); *G06N 20/00* (2019.01); *H01J 37/26* (2013.01)

(56) References Cited

U.S. PATENT DOCUMENTS

| | | | |
|---|---|---|---|
| 2005/0116182 A1* | 6/2005 | Tanaka | H01J 37/28 250/492.1 |
| 2006/0060774 A1* | 3/2006 | Oosaki | G01N 23/225 250/307 |
| 2009/0212212 A1* | 8/2009 | Shishido | G03F 7/70625 250/311 |
| 2009/0231424 A1 | 9/2009 | Honda et al. | |
| 2016/0163035 A1 | 6/2016 | Chang et al. | |
| 2017/0177997 A1* | 6/2017 | Karlinsky | G06V 10/993 |
| 2018/0082873 A1 | 3/2018 | Ohmori et al. | |
| 2021/0035833 A1* | 2/2021 | Feng | G01N 21/211 |
| 2021/0048794 A1* | 2/2021 | Moki | G05B 19/41875 |
| 2021/0374936 A1* | 12/2021 | Koopman | G06K 9/6256 |

FOREIGN PATENT DOCUMENTS

| | | |
|---|---|---|
| JP | 2012-068138 A | 4/2012 |
| JP | 2018-049936 A | 3/2018 |
| JP | 2018-506168 A | 3/2018 |

\* cited by examiner

[Fig. 1]
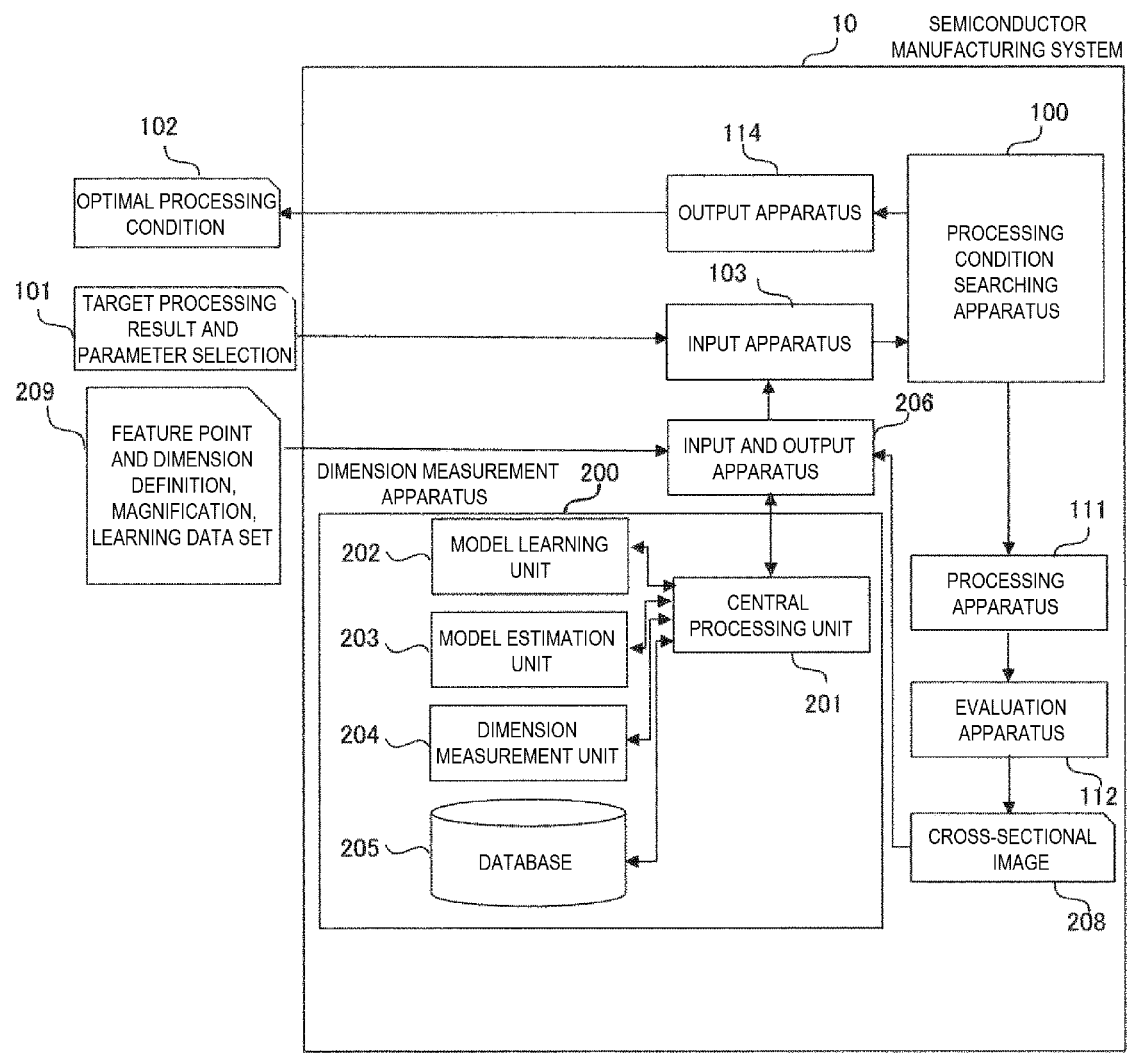

[Fig. 2]
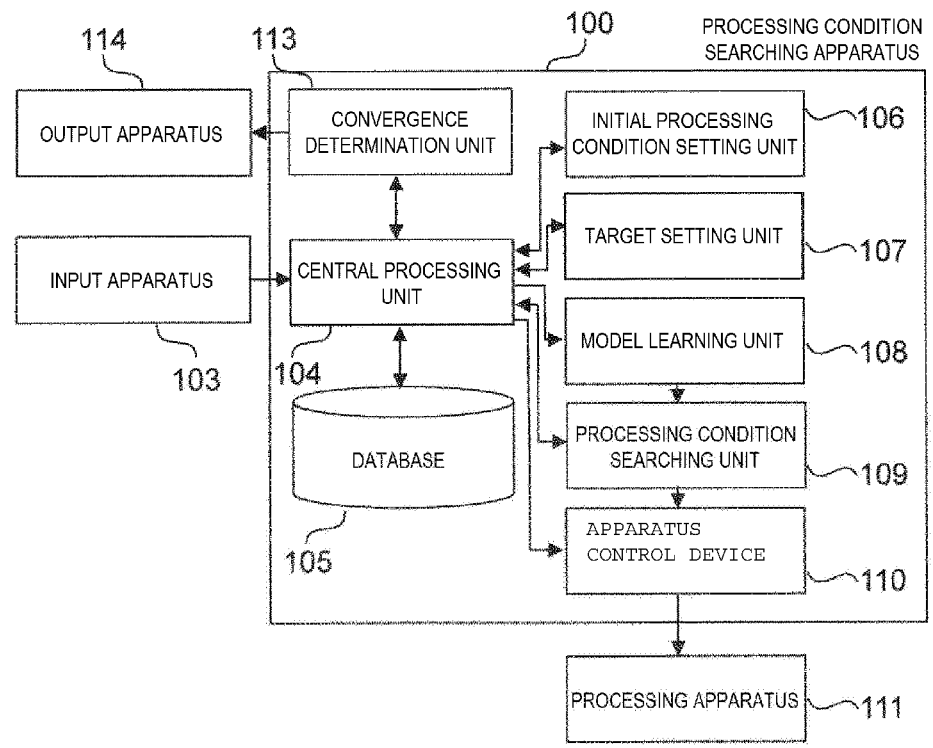
[Fig. 3]
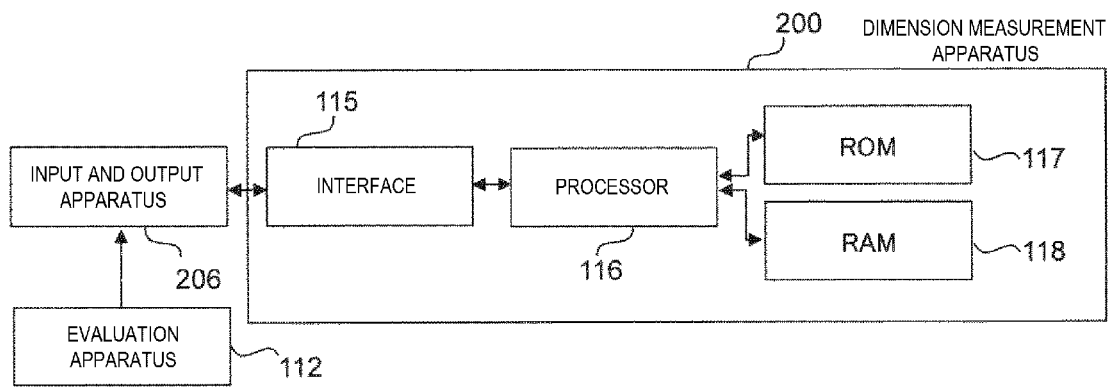

[Fig. 4]
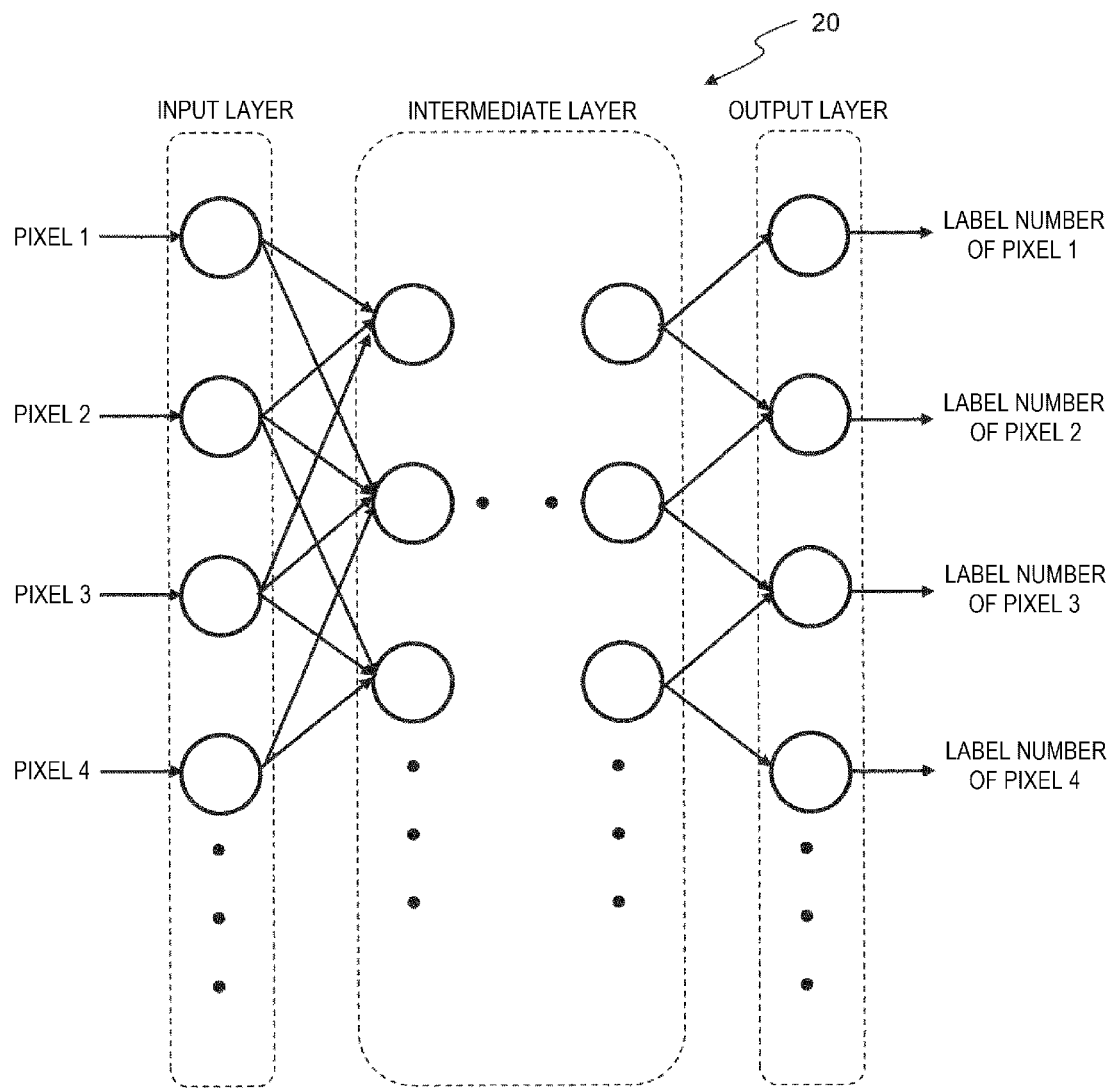

[Fig. 5]
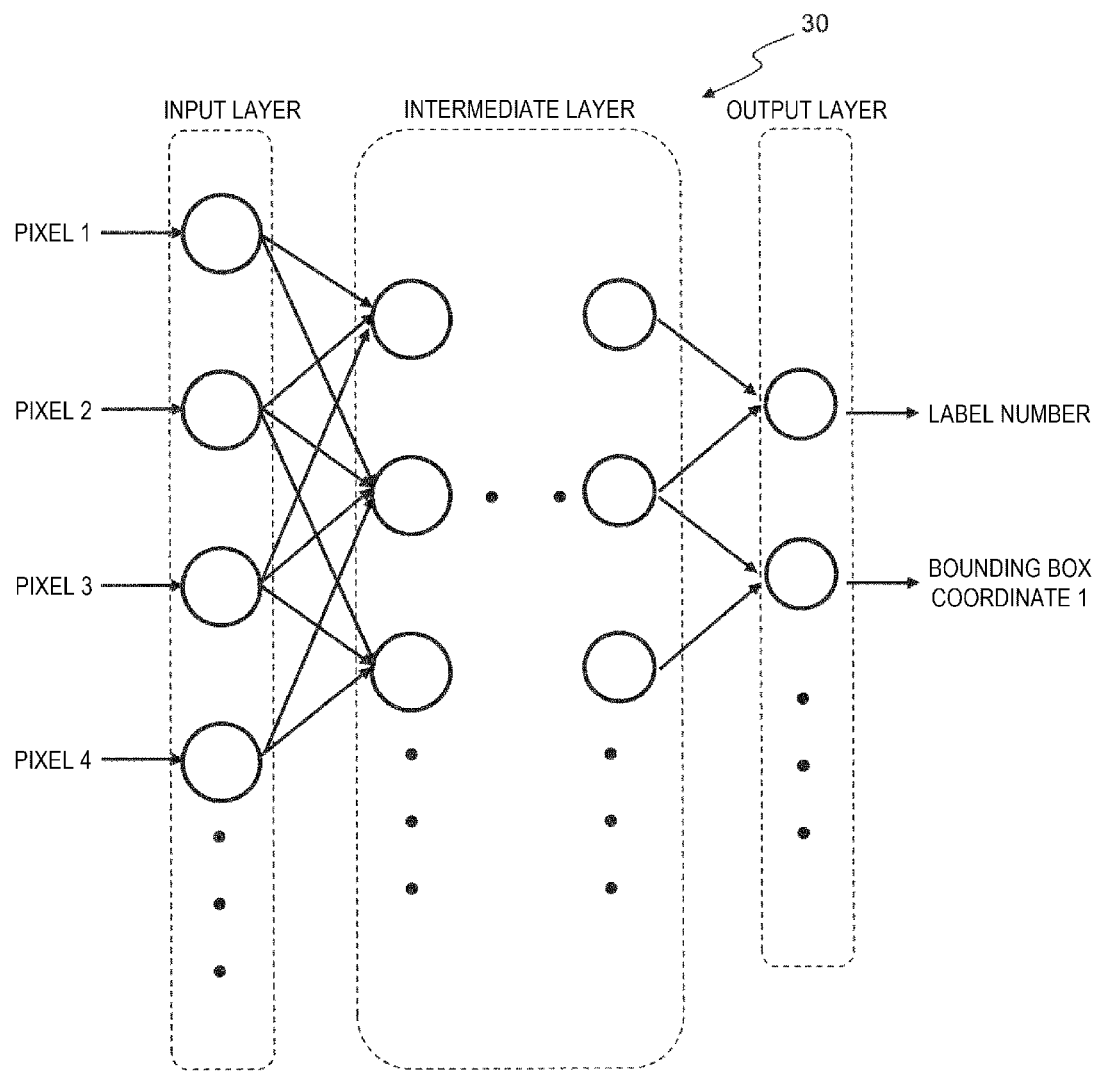

[Fig. 6]
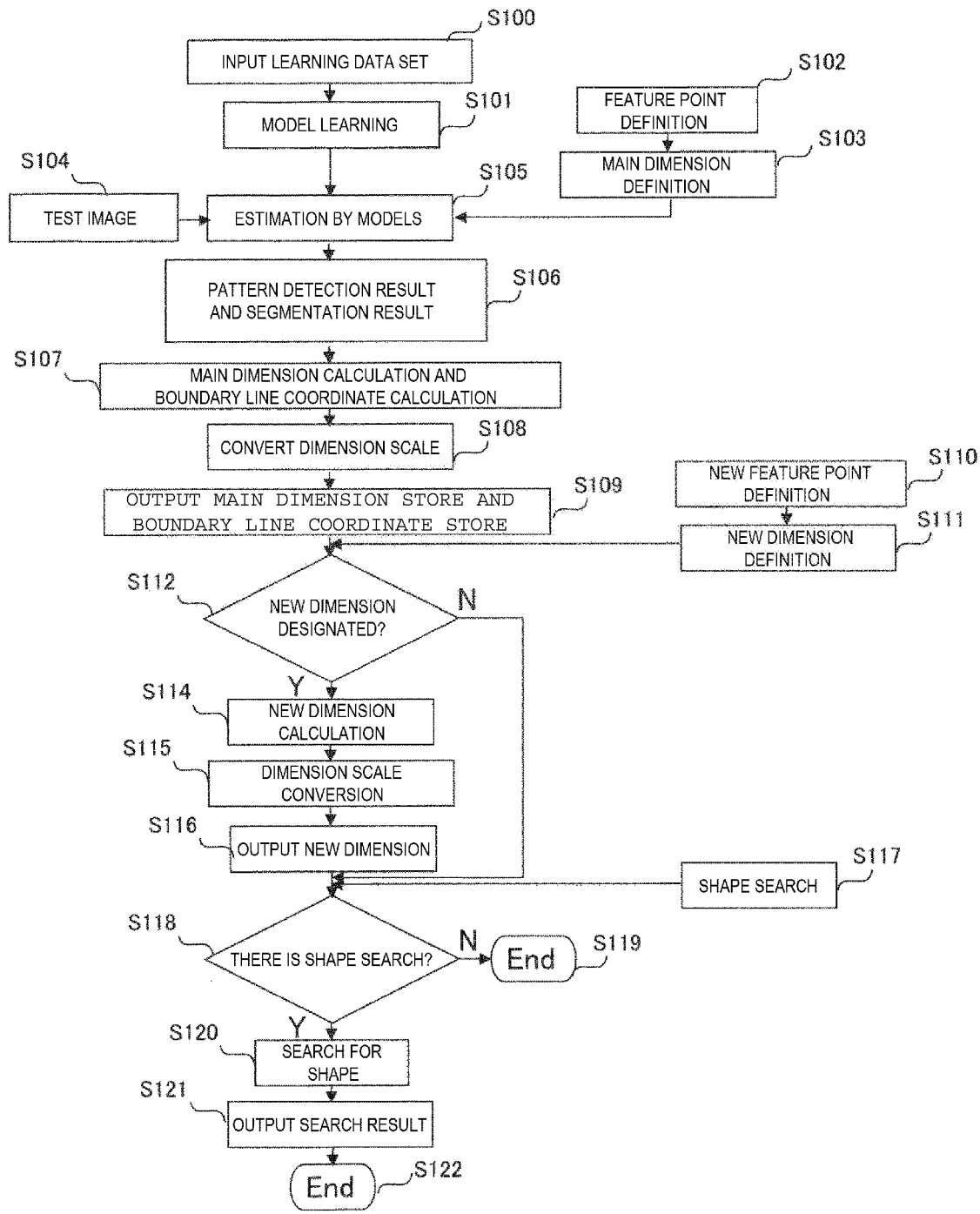

[Fig. 7]
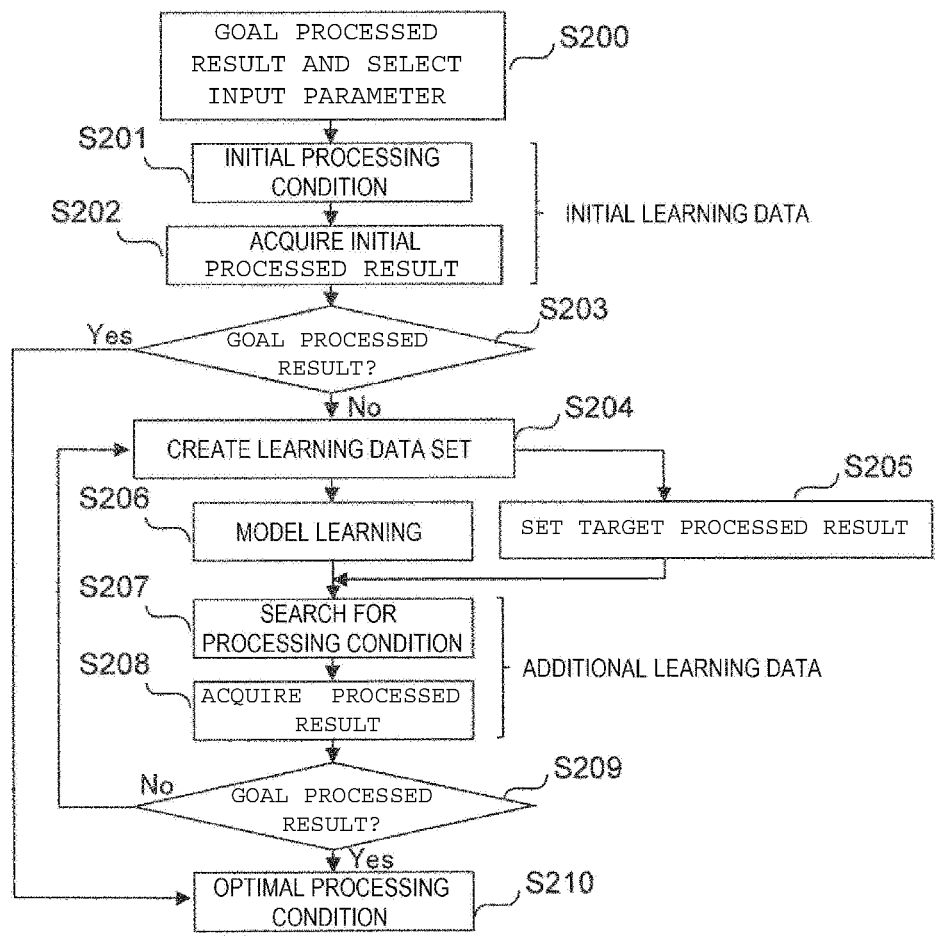

[Fig. 8]
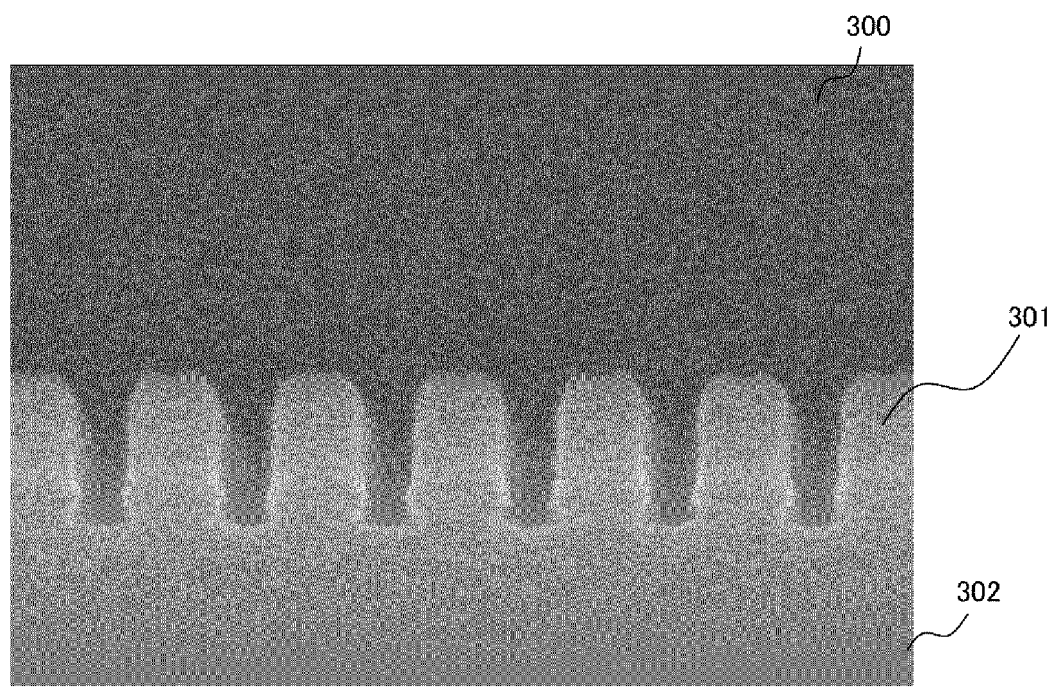

[Fig. 9]
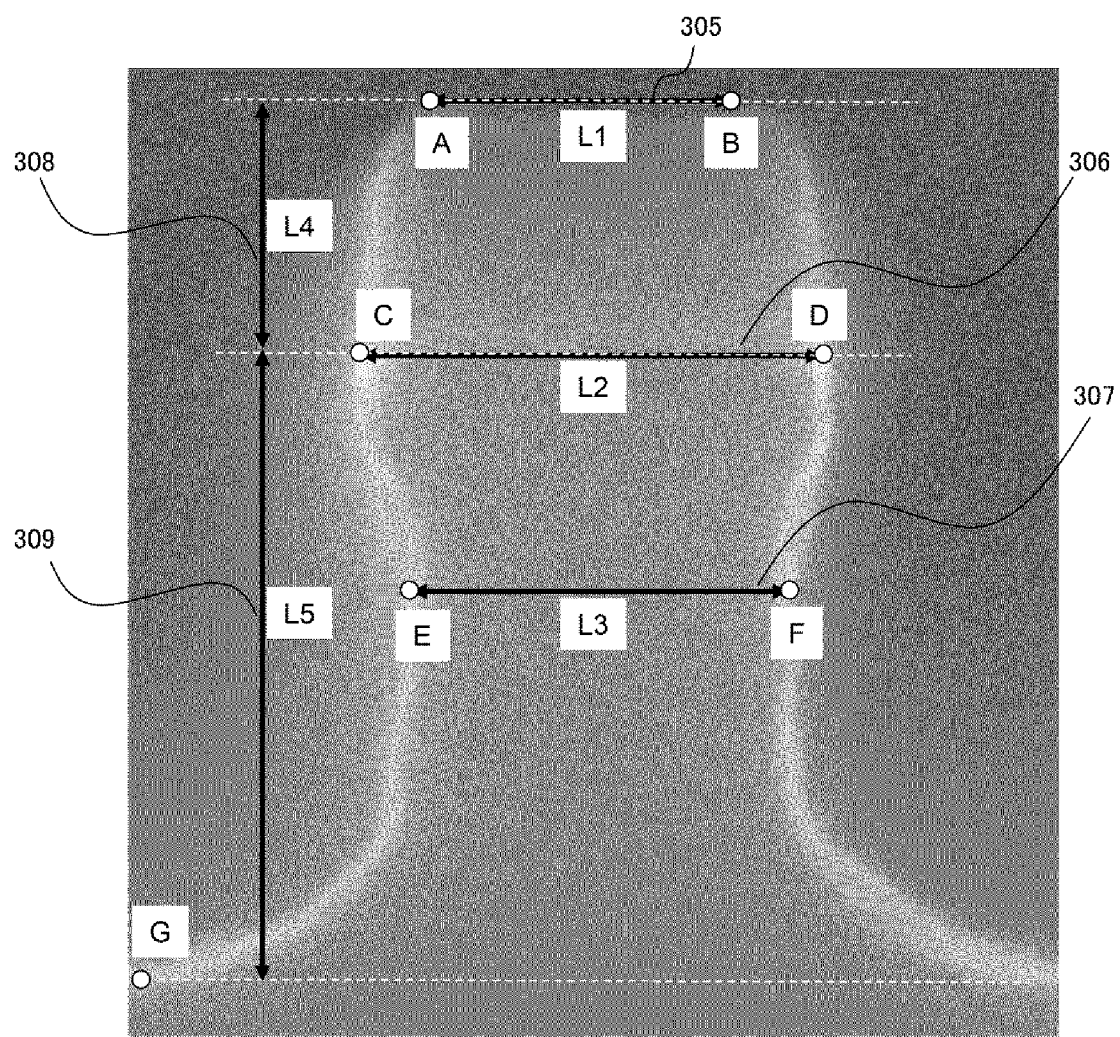

[Fig. 10]
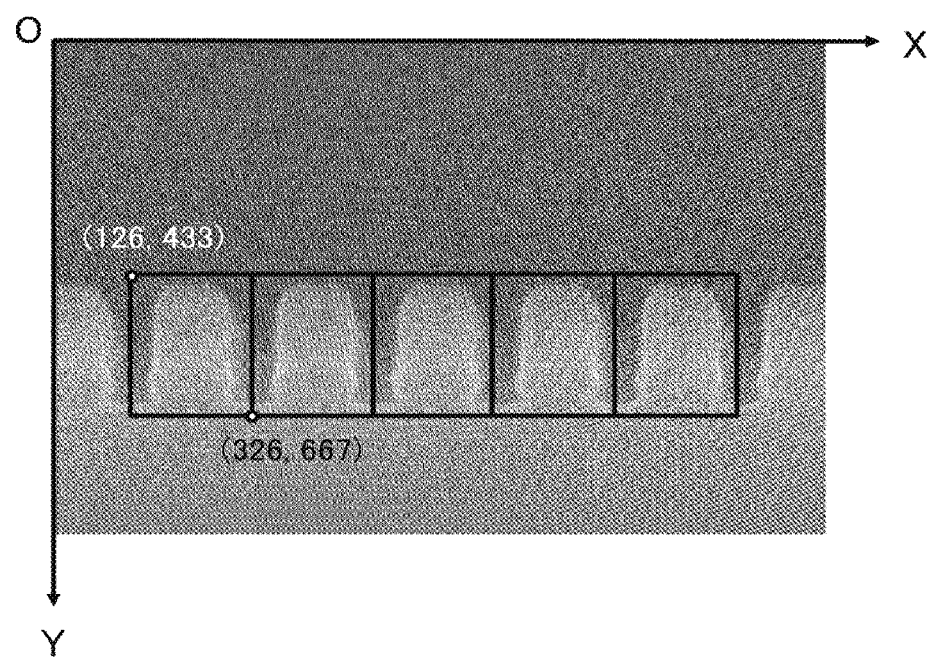

[Fig. 11]

```
<annotation>
    <folder>training</folder>
    <filename>sample001.jpg</filename>
    <size>
        <width>1280</width>
        <height>960</height>
    </size>
    <object>
        <name>pattern</name>
        <bndbox>
            <xmin>126</xmin>
            <ymin>433</ymin>
            <xmax>326</xmax>
            <ymax>667</ymax>
        </bndbox>
    </object>
    ...
</annotation>
```

[Fig. 12]
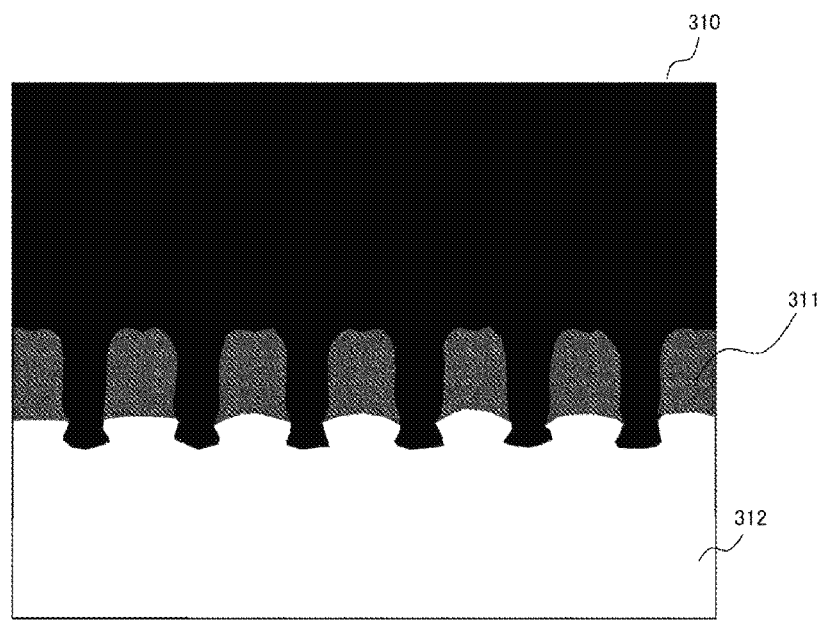
[Fig. 13]
| LABEL NAME | LABEL NUMBER | COLOR |
|---|---|---|
| BACKGROUND | 0 | BLACK |
| MASK | 1 | GRAY |
| SUBSTRATE | 2 | WHITE |

[Fig. 14]
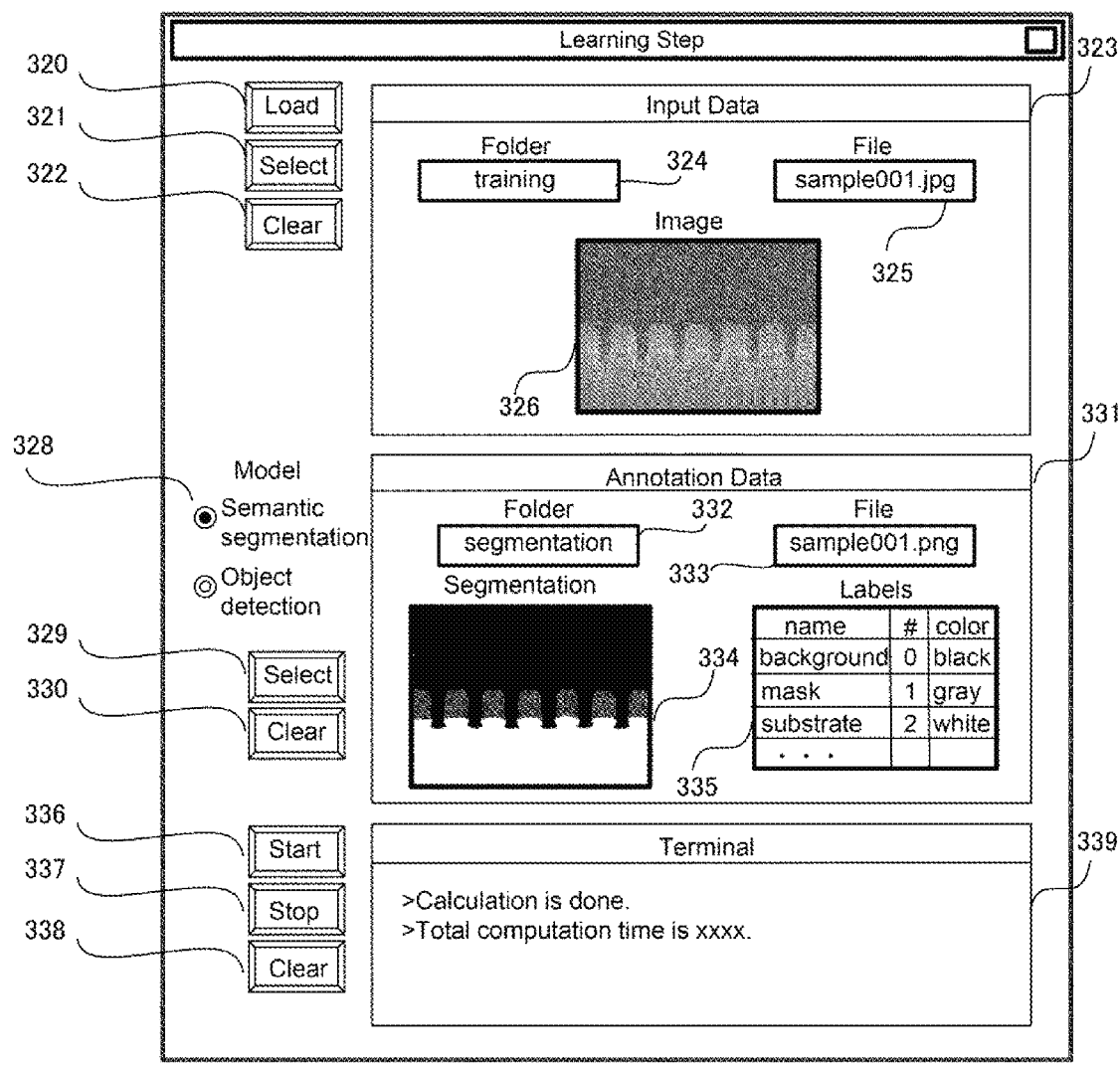

[Fig. 15]
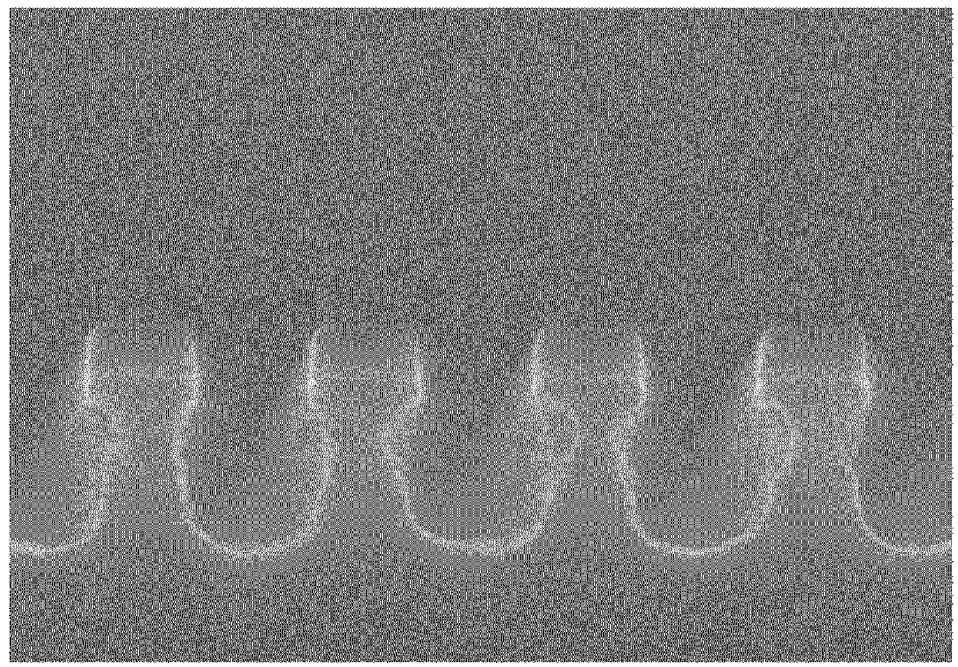
[Fig. 16]
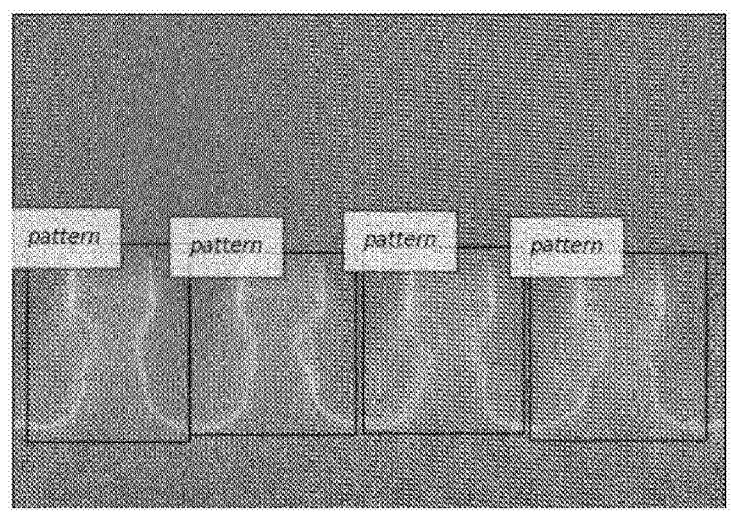

[Fig. 17]
|  | xmin | ymin | xmax | ymax |
|---|---|---|---|---|
| BOUNDING BOX 0 | 25.7 | 411.8 | 316.5 | 763.4 |
| BOUNDING BOX 1 | 316.6 | 426.6 | 615.8 | 750.3 |
| BOUNDING BOX 2 | 628.6 | 416.9 | 918.1 | 748.1 |
| BOUNDING BOX 3 | 927.7 | 427.4 | 1243.5 | 761.5 |
[Fig. 18]
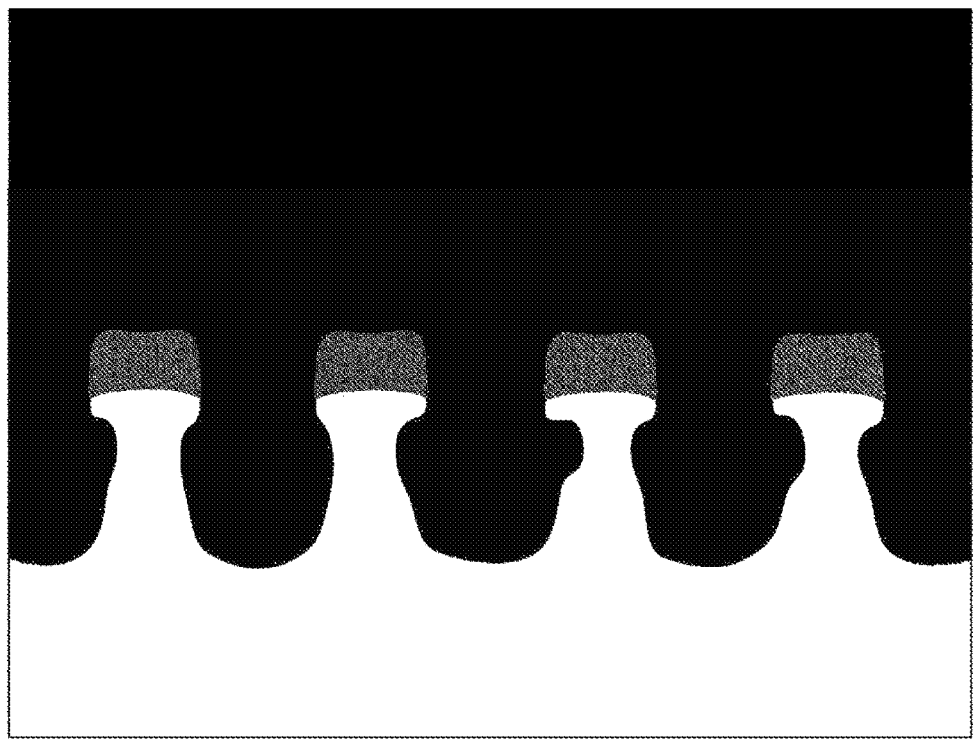

[Fig. 19]
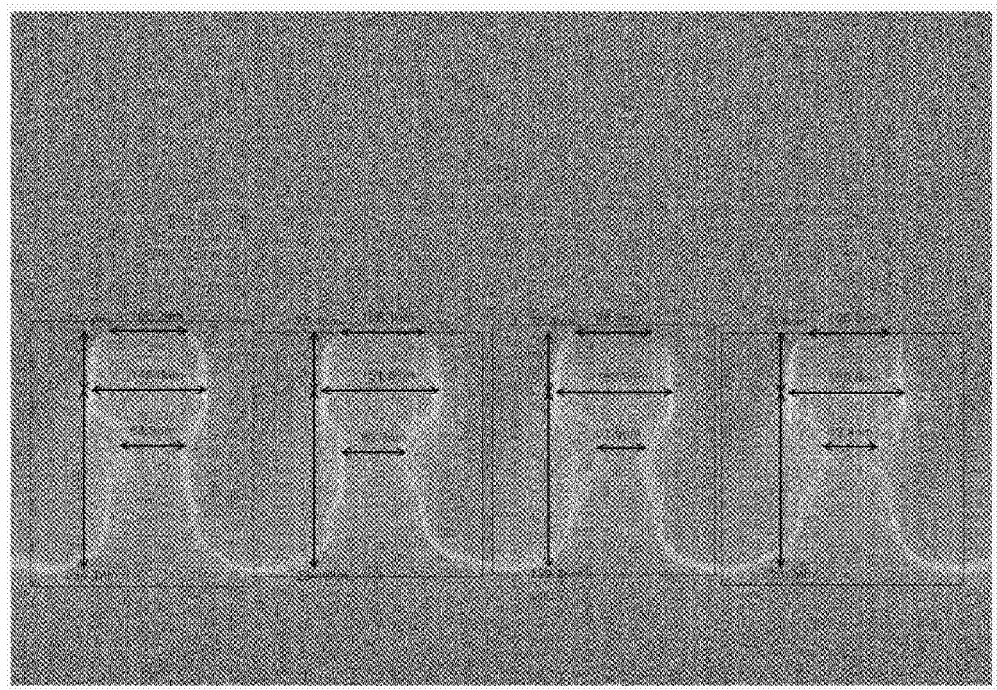
[Fig. 20]
|  | L1 [nm] | L2 [nm] | L3 [nm] | L4 [nm] | L5 [nm] |
|---|---|---|---|---|---|
| PATTERN 0 | 100.2 | 148.8 | 83.3 | 77.4 | 234.1 |
| PATTERN 1 | 108.1 | 151.8 | 82.3 | 76.4 | 234.1 |
| PATTERN 2 | 98.2 | 150.8 | 61.5 | 78.4 | 229.2 |
| PATTERN 3 | 105.2 | 150.8 | 69.4 | 78.4 | 229.2 |
| AVERAGE | 102.9 | 150.6 | 74.1 | 77.7 | 231.6 |
| STANDARD DEVIATION | 4.5 | 1.3 | 10.5 | 1.0 | 2.8 |

[Fig. 21]
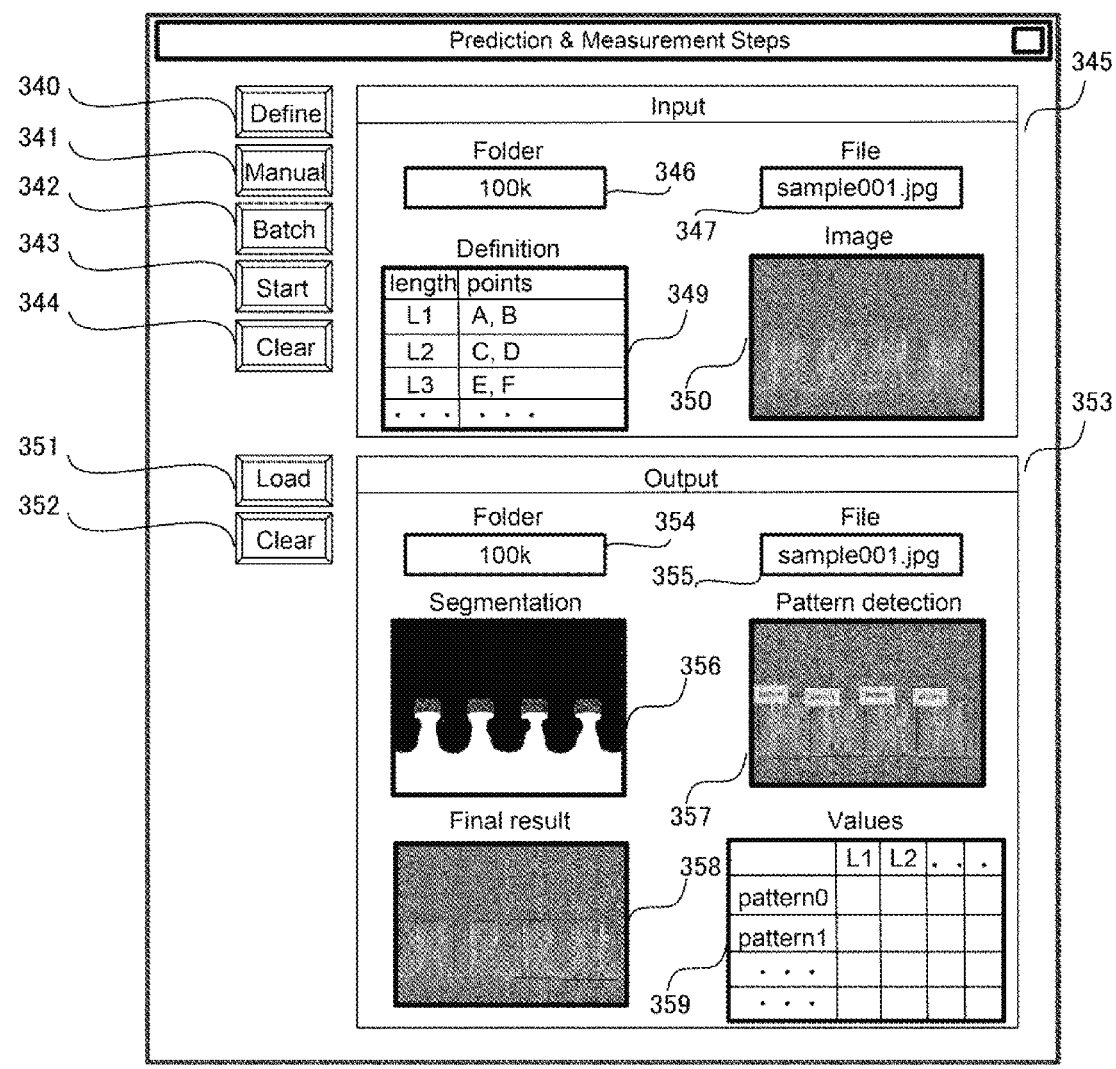

[Fig. 22]
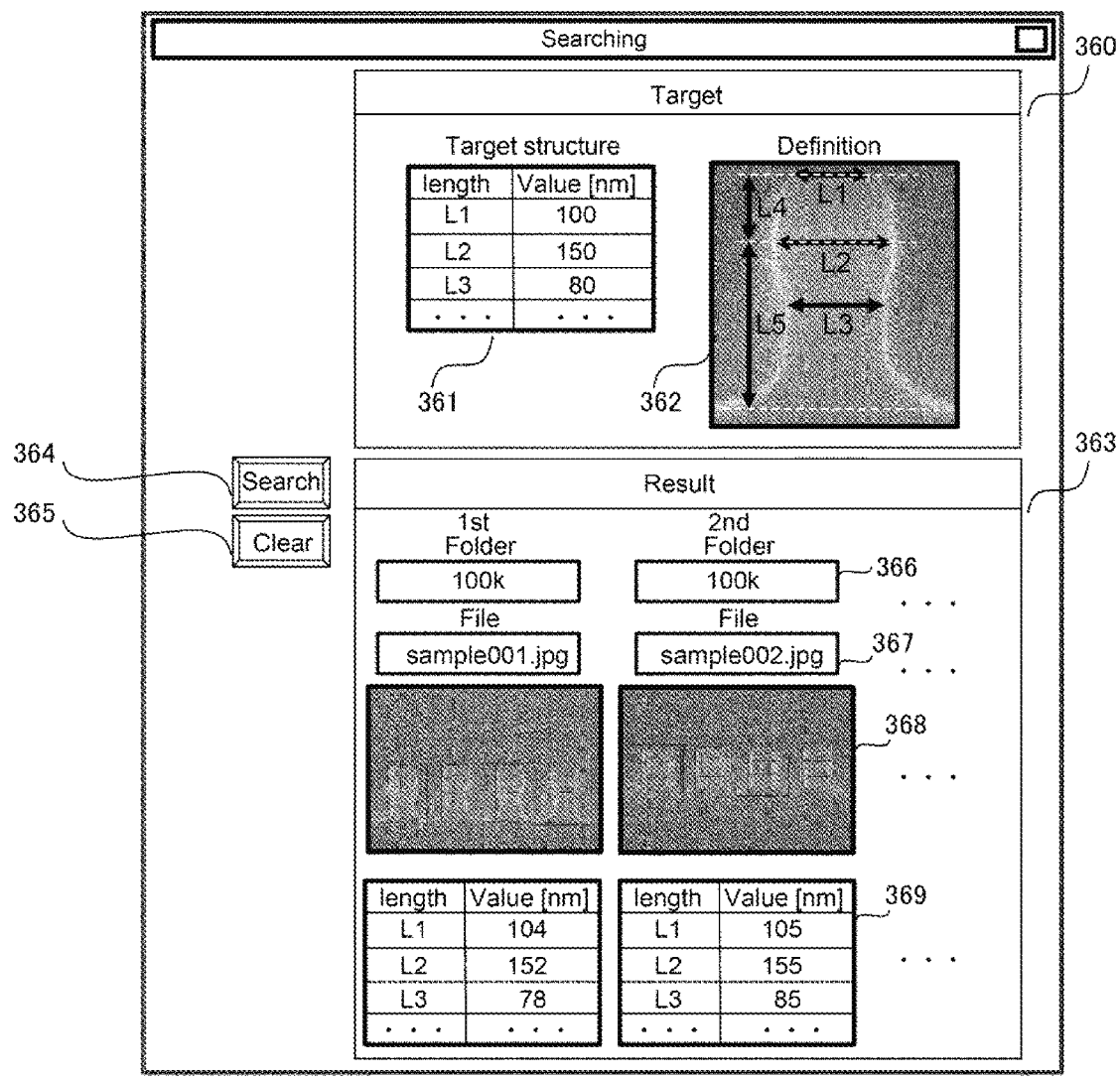

[Fig. 23]
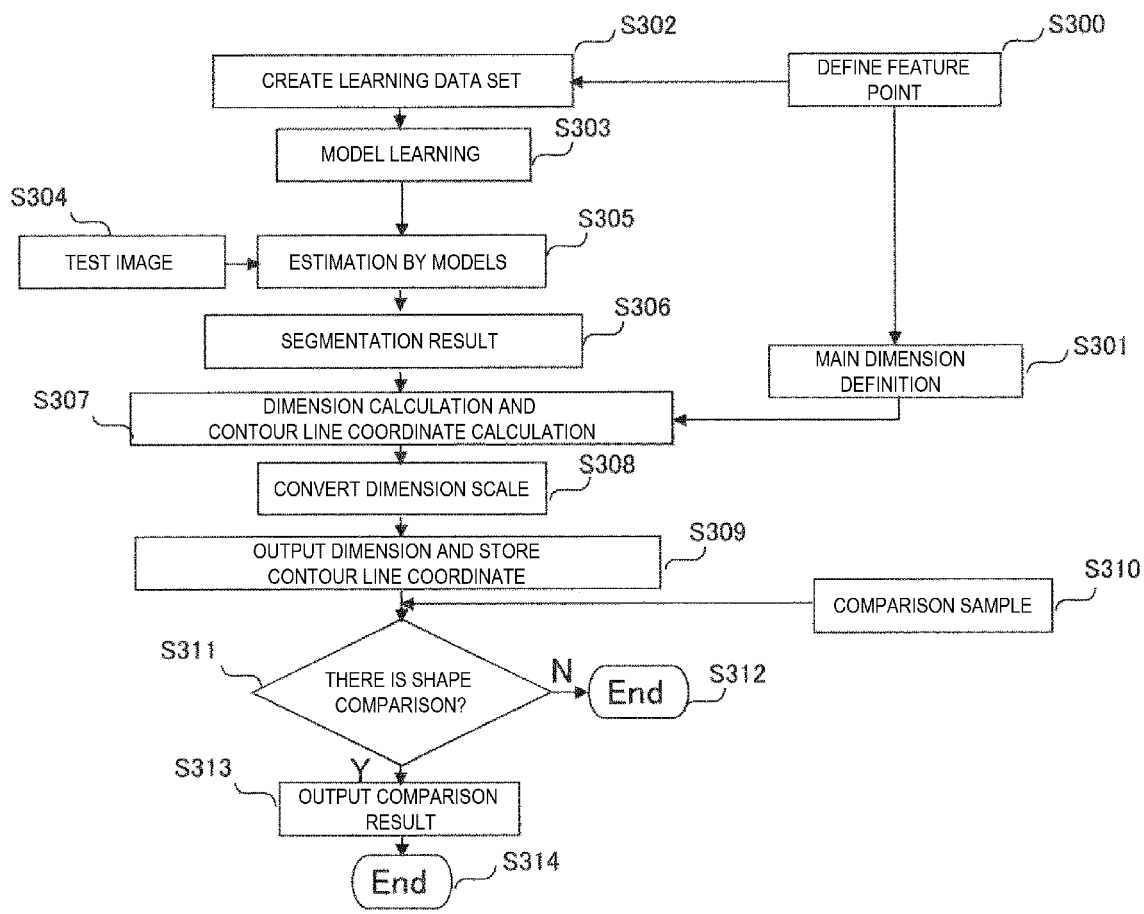

[Fig. 24]
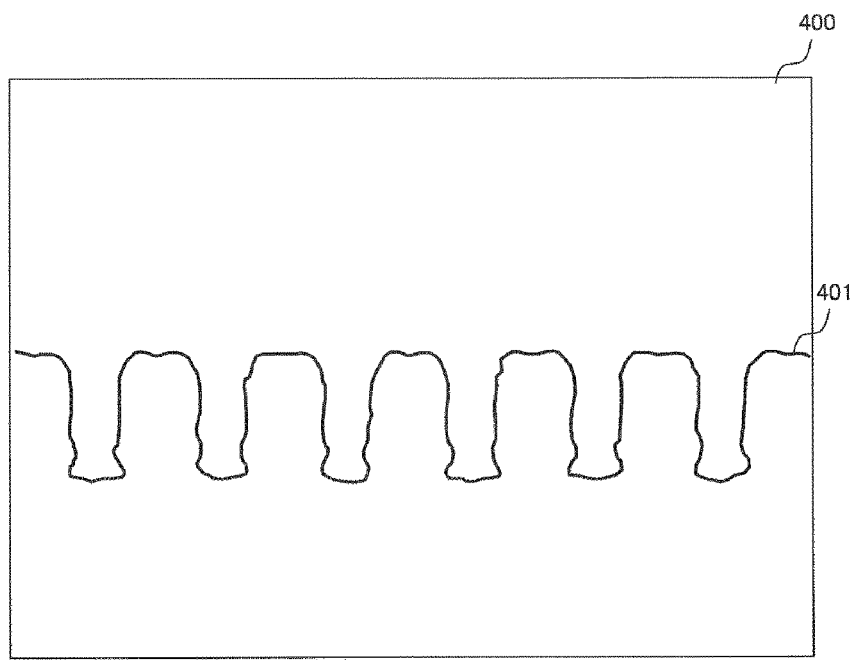
[Fig. 25]
| LABEL NAME | LABEL NUMBER | COLOR |
|---|---|---|
| BACKGROUND | 0 | WHITE |
| CONTOUR | 1 | BLACK |

[Fig. 26]
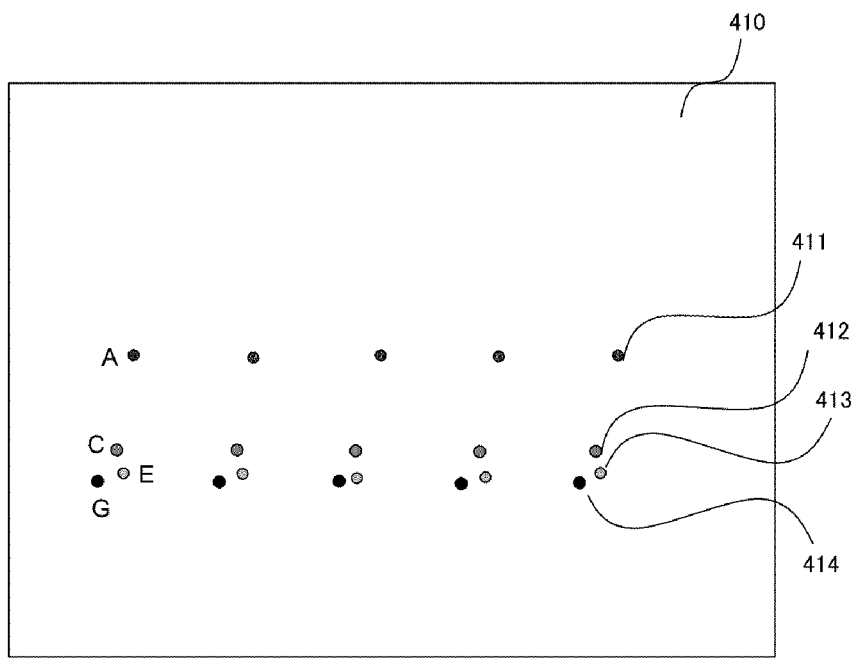
[Fig. 27]
| LABEL NAME | LABEL NUMBER | COLOR |
|---|---|---|
| BACKGROUND | 0 | WHITE |
| A | 1 | RED |
| C | 2 | GREEN |
| E | 3 | BLUE |
| G | 4 | BLACK |

[Fig. 28]
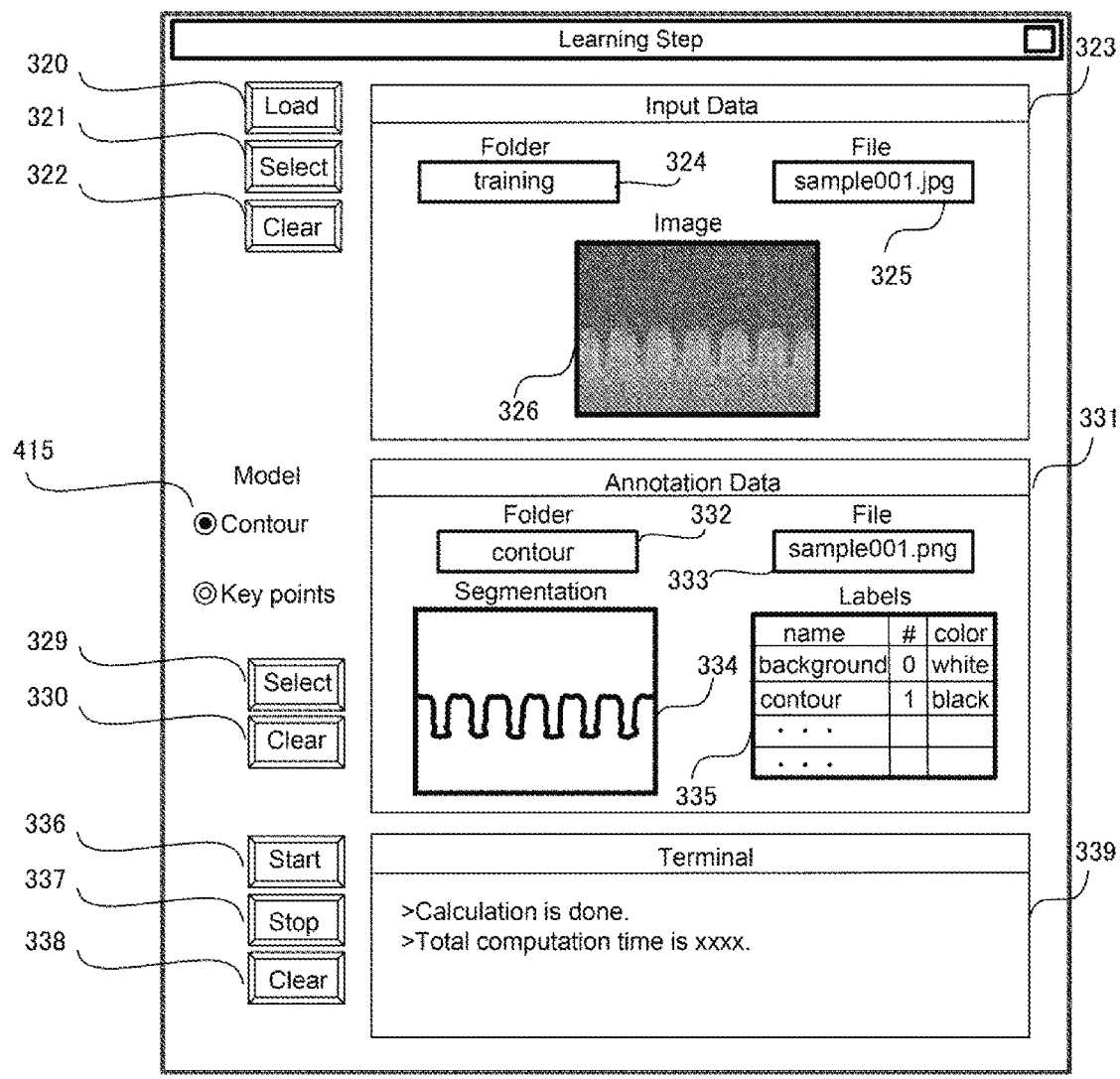

[Fig. 29]
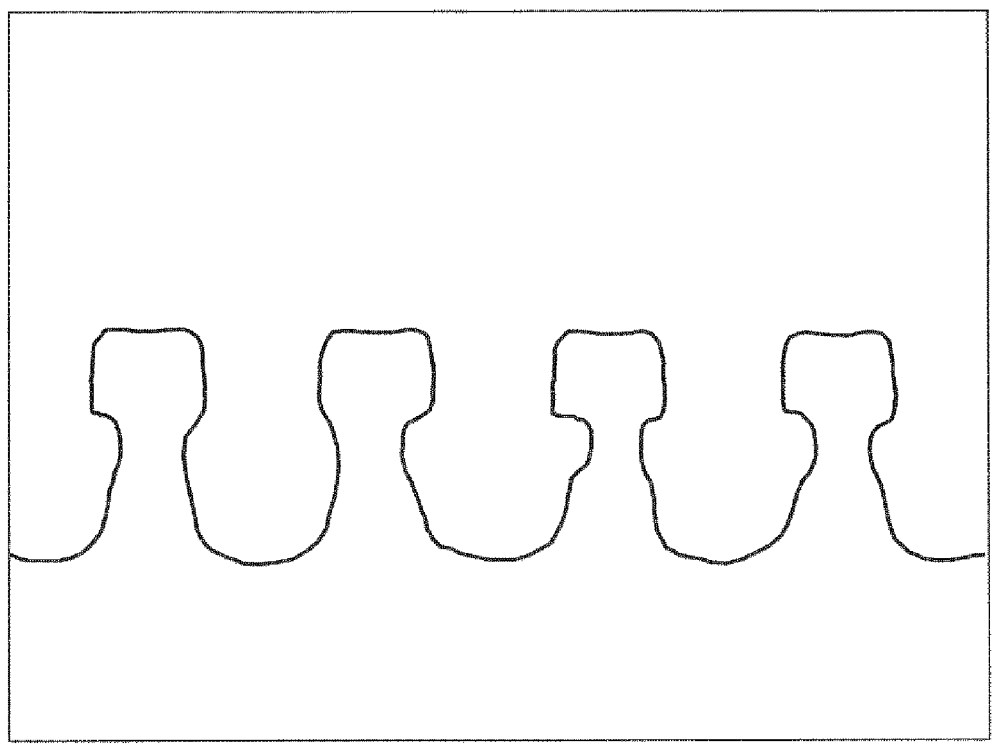

[Fig. 30]
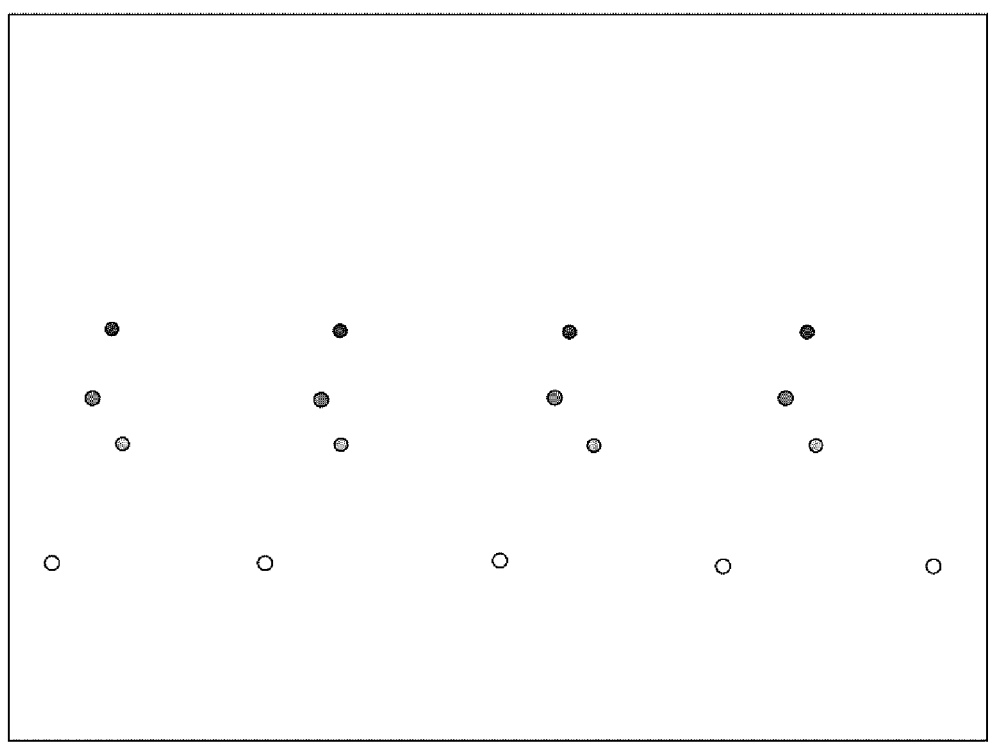

[Fig. 31]
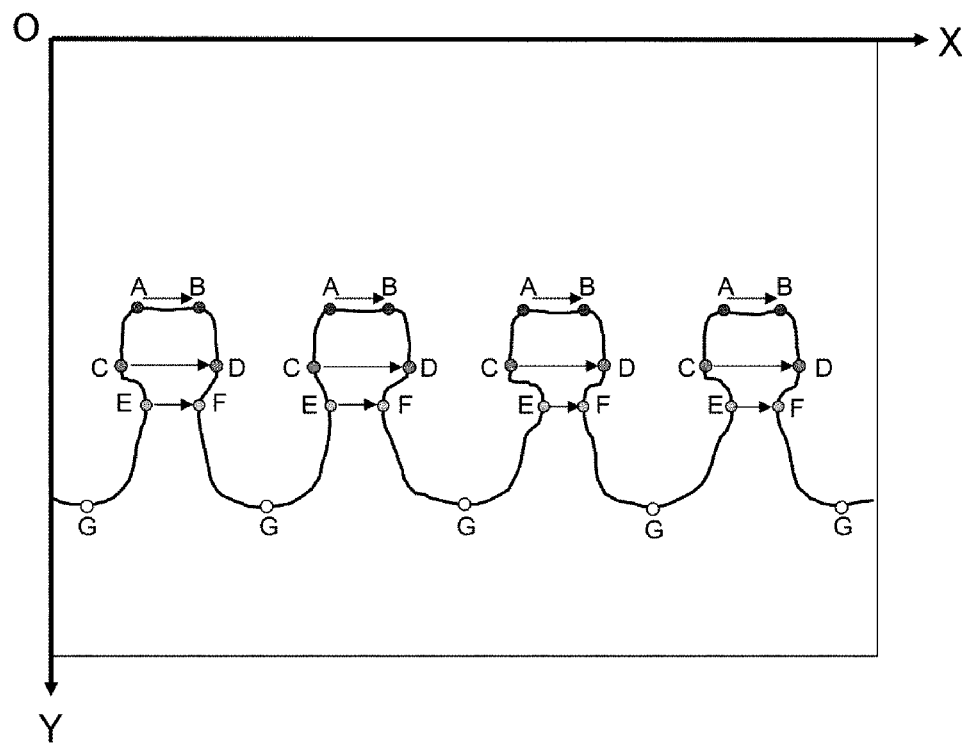

[Fig. 32]
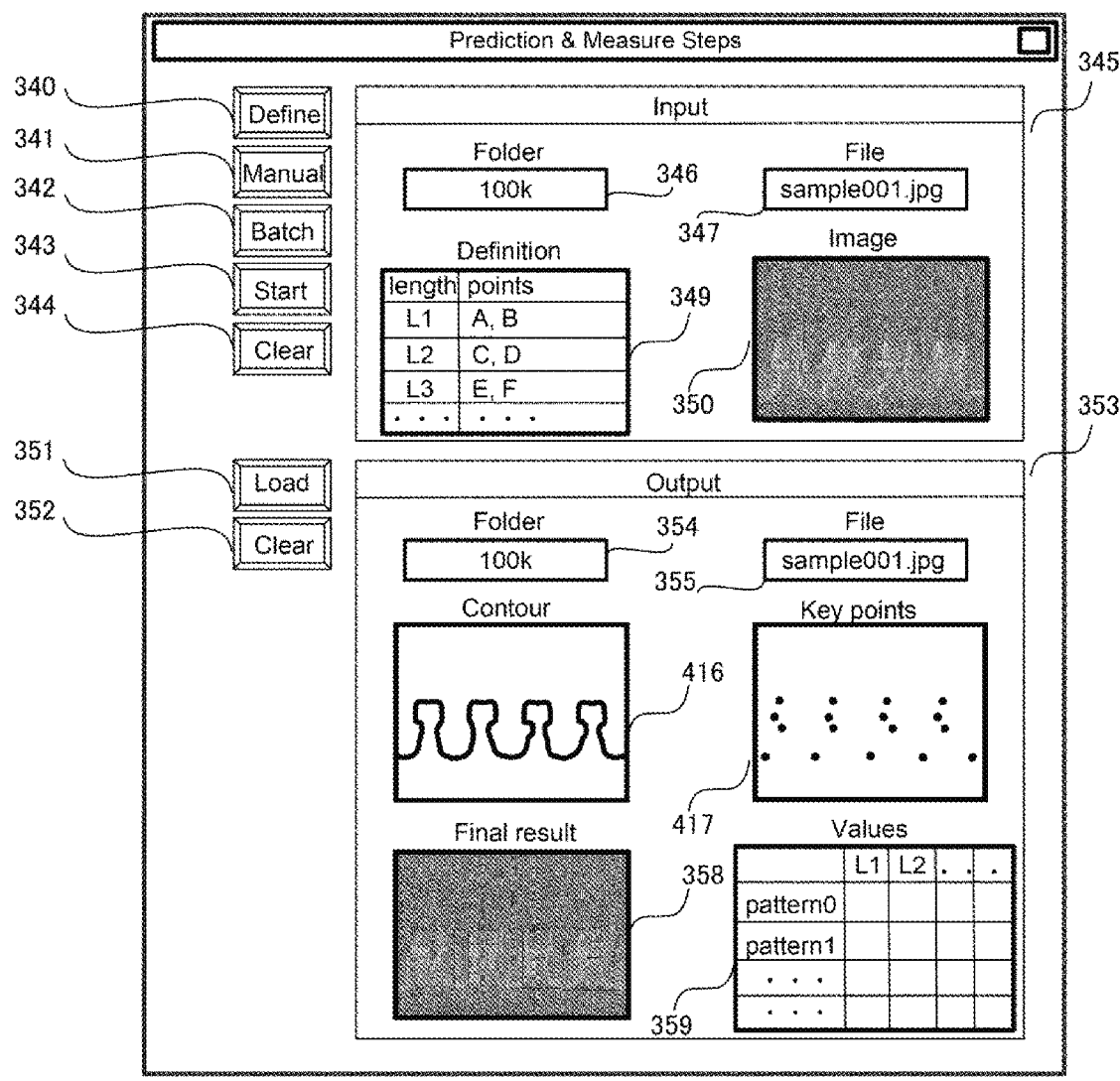

[Fig. 33]
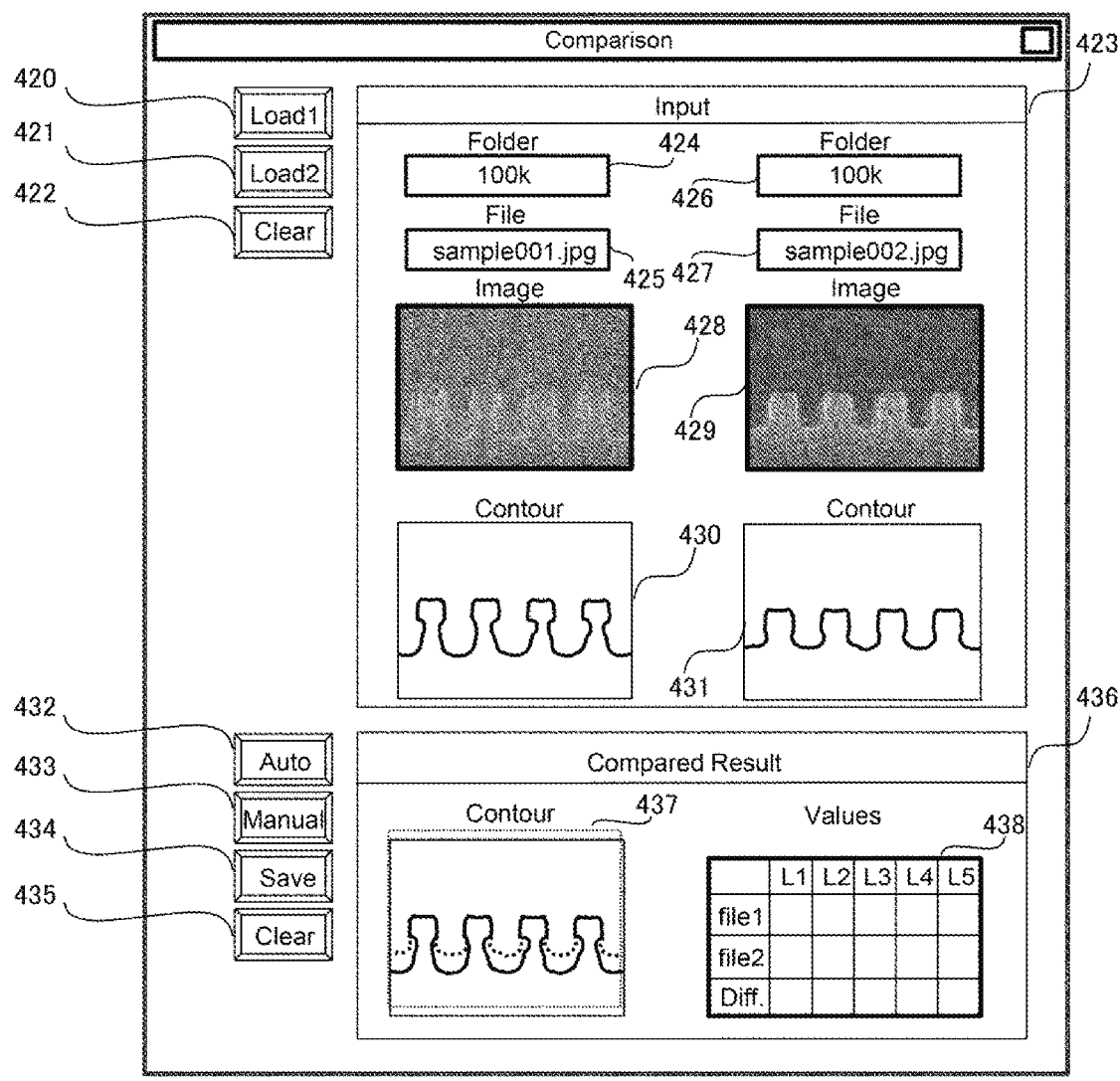

US 11,600,536 B2

DIMENSION MEASUREMENT APPARATUS, DIMENSION MEASUREMENT PROGRAM, AND SEMICONDUCTOR MANUFACTURING SYSTEM

TECHNICAL FIELD

The present invention relates to a dimension measurement apparatus that measures a processed result by a processing apparatus, a dimension measurement program, and a semiconductor manufacturing system including a dimension measurement apparatus and a processing condition searching apparatus.

BACKGROUND ART

In recent years, in order to improve performance of a semiconductor device, a new material is introduced into the semiconductor device, and at the same time, a structure of the semiconductor device is complicated. In addition, processing of an advanced semiconductor device requires nanometer-level accuracy. Therefore, a semiconductor processing apparatus needs to be able to process various kinds of materials into various shapes with high accuracy, and is inevitably an apparatus having a large number of control parameters (input parameters).

In an etching apparatus which is a typical semiconductor processing apparatus, the number of setting items for controlling plasma discharges is 30 or more. Assuming that a discharge when these setting values are fixed is one step, processing proceeds while switching steps having different setting values one after another. In an advanced process, 10 steps or more are usually used in one processing step, and 30 steps or more are used when there are many, and several hundreds of processing tests are performed in order to optimize a combination of steps and all the setting values in the steps. The number of engineers with know-how to extract apparatus performance and high apparatus operation skills is limited, and in the future, cases are expected to increase in which condition derivation and apparatus operation will not proceed as planned.

To solve the problem, PTL 1 proposes a method of automatically searching for an optimal processing condition. Accordingly, the number of steps can be reduced in each stage as compared with the method in the related art that relies on trials and errors of the engineers.

PTLs 2 and 3 are related-art literatures disclosing dimension measurement based on a cross-sectional image of a pattern. In PTL 2, a contour line is obtained from a luminance value of an image, coordinate values of two points in an upper part and a lower part of a pattern cross section are used, and a signal component of a white shadow portion proper to a cross-sectional Scanning Electron Microscope (SEM) image is manually removed, thereby improving measurement accuracy of a side wall angle. In PTL 3, an edge point is obtained from a change in a luminance value of a cross-sectional SEM image, and a straight line that approximates each side of a pattern is determined, thereby reducing dependence on an operator in measuring an angle and a length of each side.

CITATION LIST

Patent Literature

PTL 1: JP-A-2018-49936
PTL 2: JP-A-2012-68138
PTL 3: JP-A-2002-350127

SUMMARY OF INVENTION

Technical Problem

In PTL 1, the number of steps of a dimension measurement step based on a cross-sectional SEM image is required in addition to calculation time. At present, the dimension measurement is often manually performed. When applied to an advanced process, a structure is complicated and the number of measurement points per image is also increased. Accordingly, the dimension extraction performed manually is reaching a limit.

To construct a process for implementing a desired structure in a short period of time, it is necessary to search for and refer to similar structures from a large amount of existing experimental data, and at this time, a database in which processing shapes are quantified is necessary. However, at present, the structure is often quantified manually. Further, in the course of proceeding with condition derivation, when measurement locations more important than originally planned positions are found, re-measurement of the entire image is necessary. If the dimension can be automatically extracted, time required is greatly shortened and a more accurate processing shape can be grasped. By displaying an extraction result on an image and outputting the extraction result, it is possible to visually determine whether there is a problem in extraction. Thus, merit of automation is very large.

In manual measurement, a measurement value is operator-dependent. Further, even in an image in which a unit pattern of line/space is repeated, a human error may be added to a statistical value of the measurement value in addition to process variation since measurement is performed for each individual pattern.

Although the methods disclosed in PTLs 2 and 3 can reduce the operator dependence to some extent, the operator dependence still remains since the methods involve visual operation. Since measurement is performed while viewing images one by one, work time is required. Further, when it is desired to add or change a dimension measurement point at a later date, it is necessary to perform image acquisition again from the beginning or to visually measure the image.

Cross-sectional SEM images have difficulties in dimension measurement that are not found in a Critical Dimension SEM image that brightness differs for each image, a deep structure unnecessary for dimension measurement is shown, and a boundary of an interface between different kinds of materials whose dimensions are to be measured is unclear. Therefore, in the methods of PTLs 2 and 3 based on an edge detection method using a luminance value, it is necessary to perform operation such as parameter tuning of a threshold value for each image, or to visually determine and designate an interface position. In order to implement the completely automatic measurement requiring no visual adjustment, it is necessary to extract a contour of an object by recognizing a region of each object in the image instead of local luminance distribution. It is considered that such image recognition having performance equal to or better than visual observation can be implemented by applying an image recognition technique using machine learning, particularly deep learning.

An object of the invention is to implement a measurement method that enables a reduction in dimension measurement time and does not include an error caused by an operator by automatically measuring a desired dimension based on a cross section SEM images by means of an image recognition technique using machine learning, particularly deep learning.

Solution to Problem

One aspect of the invention provides a dimension measurement apparatus that measures a dimension of a semiconductor device having a repetitive pattern from a cross-sectional image of the semiconductor device. The dimension measurement apparatus includes: a processor; a memory; and a dimension measurement program that is stored in the memory and measures a dimension of the semiconductor device by being executed by the processor. The dimension measurement program includes a model estimation unit and a dimension measurement unit, the model estimation unit outputs, by a first image recognition model, a labeled image in which the cross-sectional image is labeled for each region, and outputs, by a second image recognition model, coordinates where unit patterns constituting the repetitive pattern are respectively located in the cross-sectional image, and the dimension measurement unit obtains coordinates of a plurality of feature points defined in advance for each of the unit patterns using the labeled image and the coordinates where the unit patterns are located, and measures a dimension defined as a distance between two predetermined points among the plurality of feature points.

Further, another aspect of the invention provides a dimension measurement apparatus that measures a dimension of a semiconductor device having a repetitive pattern from a cross-sectional image of the semiconductor device. The dimension measurement apparatus includes: a processor; a memory; and a dimension measurement program that is stored in the memory and measures a dimension of the semiconductor device by being executed by the processor. The dimension measurement program includes a model estimation unit and a dimension measurement unit, the model estimation unit outputs, by a first image recognition model, a first labeled image in which the cross-sectional image is labeled in a contour line and a background, and outputs, by a second image recognition model, a second labeled image in which the cross-sectional image is labeled in a background and a first plurality of feature points defined in a unit pattern constituting the repetitive pattern, and the dimension measurement unit uses coordinates of the contour line from the first labeled image and coordinates of the first plurality of feature points from the second labeled image to obtain a second plurality of feature points, and measures a dimension defined as a distance between a predetermined point of the first plurality of feature points and a predetermined point of the second plurality of feature points.

Advantageous Effect

A high-speed dimension measurement with reduced operator dependence can be implemented. Problems, configurations, and effects other than those described above will become apparent from the following description of embodiments.

BRIEF DESCRIPTION OF DRAWINGS

FIG. 1 is a diagram showing a system configuration example of a semiconductor manufacturing system.

FIG. 2 is a diagram showing a system configuration example of a processing condition searching apparatus.

FIG. 3 is a block diagram showing a hardware configuration of a dimension measurement apparatus.

FIG. 4 is a diagram showing an example of a semantic segmentation model.

FIG. 5 is a diagram showing an example of an object detection model.

FIG. 6 is a flowchart (first embodiment) of measuring a dimension by the dimension measurement apparatus based on an input image.

FIG. 7 is a flowchart of searching for a processing condition by the processing condition searching apparatus.

FIG. 8 is an example of an input data set (a cross-sectional image).

FIG. 9 is an example of a dimension measurement point.

FIG. 10 is a diagram for illustrating a coordinate system of a bounding box.

FIG. 11 is a description example of annotation data used for learning of the object detection model.

FIG. 12 is an example of annotation data used for learning of the semantic segmentation model.

FIG. 13 is a table showing a correspondence among a label name, a label number, and a color in the annotation data used for learning the semantic segmentation model.

FIG. 14 is an example of a GUI screen displayed at the time of a learning step.

FIG. 15 is an example of a test image of measuring a dimension.

FIG. 16 is a diagram showing an object detection result obtained by inputting the test image into a learned object detection model.

FIG. 17 is a table illustrating coordinates of bounding boxes obtained by inputting the test image into the learned object detection model.

FIG. 18 is a diagram showing a semantic segmentation result obtained by inputting the test image into a learned semantic segmentation model.

FIG. 19 is a diagram showing bounding boxes and dimension measurement results on the test image.

FIG. 20 is a table illustrating dimension values measured for each pattern.

FIG. 21 is an example of a GUI screen displayed at the time of a prediction and measurement step.

FIG. 22 is an example of a GUI screen displayed at the time of a goal or target shape searching step.

FIG. 23 is a flowchart (second embodiment) of measuring a dimension based on an input image by the dimension measurement apparatus.

FIG. 24 is an example of an annotation image used to learn a first semantic segmentation model that detects a contour line.

FIG. 25 is a table showing a correspondence among a label name, a label number, and a color in an annotation image used for learning the first semantic segmentation model.

FIG. 26 is an example of annotation data used for learning a second semantic segmentation model that detects feature points.

FIG. 27 is a table showing a correspondence among a label name, a label number, and a color in the annotation data used for learning the second semantic segmentation model.

FIG. 28 is an example of a GUI screen displayed at the time of the learning step.

FIG. 29 is a diagram showing a contour line detection result obtained by inputting a test image into a learned first semantic segmentation model.

FIG. 30 is a diagram showing a feature point detection result obtained by inputting a test image into a learned second semantic segmentation model.

FIG. 31 is a diagram illustrating a method of obtaining coordinates of other feature points necessary for dimension measurement based on coordinates of detected feature points.

FIG. 32 is an example of a GUI screen displayed at the time of the prediction and measurement step.

FIG. 33 is an example of a GUI screen displayed at the time of a shape comparison step.

DESCRIPTION OF EMBODIMENTS

In the present embodiments, two image recognition models are used to measure a dimension of a semiconductor device having a repetitive pattern based on a cross-sectional image of the semiconductor device. Here, the semiconductor device includes not only a finished product but also a semiconductor device being processed, and it does not matter whether the semiconductor device is in a wafer state or an individually separated chip state. A first image recognition model is an image recognition model that extracts a boundary line between a processing structure and a background over the entire cross-sectional image and/or a boundary line of an interface between different kinds of materials. A second image recognition model is an image recognition model that outputs information for dividing the boundary line extending over the entire cross-sectional image obtained from the first image recognition model into unit patterns constituting a repetitive pattern. This makes it possible to automatically measure a predetermined dimension value based on a cross-sectional SEM image without visual adjustment by an operator.

Embodiments of the invention will be described below with reference to the accompanying drawings.

First Embodiment

In the first embodiment, two types of image recognition techniques are used, which are a semantic segmentation model (the first image recognition model) for extracting coordinates of the boundary line between the processing structure and the background and coordinates of the boundary line of the interface between different kinds of materials, and an object detection model (the second image recognition model) for detecting coordinates of a unit pattern.

In a preliminary learning step, in the semantic segmentation model, a cross-sectional SEM image that is input data and an annotation image that is color-coded for each region that is output data are given as teacher data to learn a shape of the region. In the object detection model, the cross-sectional SEM image that is the input data and annotation data describing coordinates of a unit pattern (designated by a rectangular bounding box surrounding the pattern) that is the output data are given as the teacher data to learn a unit pattern shape.

In a prediction step, for a given input image, an image obtained by color-coding each region is estimated using the learned semantic segmentation model, and coordinates of a unit pattern are estimated using the learned object detection model.

In a measurement step, coordinates of a region boundary obtained from the color-coded image for each region are divided for each pattern using the unit pattern coordinate, and coordinates of feature points necessary for dimension measurement are obtained, so that a dimension of a desired point is automatically measured.

FIG. 1 is a diagram showing a system configuration example of a semiconductor manufacturing system. A semiconductor manufacturing system 10 includes a processing condition searching apparatus 100, an input apparatus 103, an output apparatus 114, a processing apparatus 111, an evaluation apparatus 112, a dimension measurement apparatus 200, and an input and output apparatus 206. A user may select a goal processed result (a processing shape) and a parameter 101 used in the processing apparatus 111, input the goal processed result and the parameter 101 from the input apparatus 103, and output an optimal processing condition 102 that gives a goal processing shape from the output apparatus 114.

The processing condition searching apparatus 100 is an apparatus that receives the goal processing shape 101 from the input apparatus 103, searches for a processing condition in which the processing apparatus 111 can optimally obtain the goal processing shape, and outputs the searched processing condition to the output apparatus 114.

The input apparatus 103 includes an input interface such as a GUI and a storage medium reading device such as a card reader, and inputs data to the processing condition searching apparatus 100. Not only from the user, the input apparatus 103 also receives a dimension measurement value from the input and output apparatus 206 and inputs the value to the processing condition searching apparatus 100. The input apparatus 103 includes, for example, a keyboard, a mouse, a touch panel, and a storage medium reading device.

The output apparatus 114 displays the processing condition passed from the processing condition searching apparatus 100 as the optimal processing condition 102 to the user. Methods for displaying includes, for example, displaying on a display or writing to a file. The output apparatus 114 includes, for example, a display, a printer, and a storage medium writing device.

The processing apparatus 111 is an apparatus that processes a semiconductor or a semiconductor device containing a semiconductor. Processing contents of the processing apparatus 111 are not particularly limited. For example, a lithographic apparatus, a film forming apparatus, and a pattern processing apparatus are included. The lithographic apparatus includes, for example, an exposure apparatus, an electron beam drawing apparatus, and an X-ray drawing apparatus. The film forming apparatus includes, for example, a Chemical Vapor Deposition (CVD), a Physical Vapor Deposition (PVD), a vapor deposition apparatus, a sputtering apparatus, and a thermal oxidation apparatus. The pattern processing apparatus includes, for example, a wet etching apparatus, a dry etching apparatus, an electron beam processing apparatus, and a laser processing apparatus. The processing apparatus 111 processes the semiconductor or the semiconductor device based on the processing condition input from the processing condition searching apparatus 100, and passes the processing semiconductor or the semiconductor device to the evaluation apparatus 112.

The evaluation apparatus 112 captures a cross section of the semiconductor or the semiconductor device processed by the processing apparatus 111, and acquires a cross-sectional image 208 as a processed result. The evaluation apparatus 112 includes a processing dimension measurement device using an SEM, a Transmission Electron Microscope (TEM), and an optical monitor. A part of the semiconductor or semiconductor device processed by the processing apparatus 111 may be taken out as a fragment, and the fragment may be transported to the evaluation apparatus 112 and measured. The acquired cross-sectional image 208 is passed to the input and output apparatus 206.

The dimension measurement apparatus 200 includes a central processing unit 201, a model learning unit 202, a model estimation unit 203, a dimension measurement unit 204, and a database 205. The dimension measurement apparatus 200 receives a feature point and dimension definition, magnification, a learning data set 209, and the cross-sectional image 208 input via the input and output apparatus 206, measures a predetermined dimension from the cross-sectional image 208, and outputs the dimension to the input and output apparatus 206.

The input and output apparatus 206 includes an input and output interface such as a GUI and a storage medium reading device such as a card reader, and inputs the feature point and dimension definition, the magnification, and the learning data set 209 to the dimension measurement apparatus 200. The input and output apparatus 206 receives the cross-sectional image 208 from the evaluation apparatus 112 and passes the cross-sectional image 208 to the central processing unit 201. The input and output apparatus 206 includes, for example, a keyboard, a mouse, a display, a touch panel, and a storage medium reading device, and displays the dimension value passed from the dimension measurement apparatus 200 to the user or directly transfers the dimension value to the input apparatus 103. When displaying the dimension value to the user, methods include displaying on the display, writing to a file, or the like.

FIG. 2 is a diagram showing a system configuration example of the processing condition searching apparatus 100. The processing condition searching apparatus 100 includes a central processing unit 104, a database 105, an initial processing condition setting unit 106, a target setting unit 107, a model learning unit 108, a processing condition searching unit 109, an apparatus control device 110, and a convergence determination unit 113.

FIG. 3 is a block diagram showing a hardware configuration of the dimension measurement apparatus 200. The dimension measurement apparatus 200 measures a dimension from the cross-sectional image 208 input from the evaluation apparatus 112 via the input and output apparatus 206, and outputs a measurement result to the input and output apparatus 206. The dimension measurement apparatus 200 includes a processor 116, a communication interface 115, a ROM 117, and a RAM 118. The communication interface 115 connects the processor 116 and the external input and output apparatus 206. The processor 116 is connected to the communication interface 115, the ROM 117, and the RAM 118. A processing program executed by the processor 116 is stored in the ROM 117. Learning data, a learning model, a feature point and dimension definition, magnification, and the like are stored in the RAM 118.

In correspondence with the dimension measurement apparatus 200 shown in FIG. 1, the database 205 is installed as the ROM 117 and the RAM 118, and the model learning unit 202, the model estimation unit 203, and the dimension measurement unit 204 are installed as programs and parameters stored in the ROM 117 and the RAM 118.

FIG. 4 shows an example of a configuration of a semantic segmentation model used by the model learning unit 202 and the model estimation unit 203 of the dimension measurement apparatus 200. In the example, a neural network 20 is used. However, the invention is not limited thereto, and a machine learning model such as a decision tree may be used. With pixel information input to an input layer sequentially transmitted to an intermediate layer and an output layer and calculated, the neural network outputs a label number of a region to which each pixel belongs from the output layer. In the intermediate layer, a convolutional layer, a pooling layer, and the like are repeated for many layers. A specific layer structure is different depending on the model employed. At the time of learning, parameters of the intermediate layer are adjusted such that an error between the label of each pixel output and annotation data that is a correct answer is minimized.

FIG. 5 shows an example of a configuration of an object detection model used by the model learning unit 202 and the model estimation unit 203 of the dimension measurement apparatus 200. In the example, a neural network 30 is used. However, the invention is not limited thereto, and other models such as template matching may be used. With pixel information input to an input layer sequentially transmitted to an intermediate layer and an output layer and calculated, the neural network outputs a label number of an object included in an image and coordinate values of a bounding box from the output layer. In the intermediate layer, a convolutional layer, a pooling layer, and the like are repeated for many layers. A specific layer structure is different depending on the model employed. At the time of learning, parameters of the intermediate layer are adjusted such that an error between the label number of the object, the coordinate values of the bounding box output and annotation data that is a correct answer is minimized.

FIG. 6 is a flowchart executed by the dimension measurement apparatus 200 until a required dimension is measured from an input image.

First, the learning data set 209 to be input to the dimension measurement apparatus 200 is created in advance. The learning data set consists of, in addition to the cross-sectional SEM image that is input data, a set of annotation images 209 in which annotation data 209, which describes coordinates of a bounding box surrounding a unit pattern for the object detection model that is output data, is color-coded for each region for the semantic segmentation model, and the learning data set is input from the input and output apparatus 206 (step S100). The input learning data set is stored in the database 205.

Next, the central processing unit 201 transfers the learning data set and a model from the database 205 to the model learning unit 202, and performs learning of two models by the model learning unit 202 (step S101). Parameters of the learned models are stored in the database 205. In the following description, a neural network having a convolutional layer and a pooling layer is used as the model. A machine learning model such as a decision tree can also be used as a semantic segmentation model, and a machine learning model such as template matching can also be used as an object detection model.

Next, in the estimation step, a test image whose dimension is to be measured is input from the input and output apparatus 206 (step S104). At the same time, the feature point definition 209 and the dimension definition 209 to be measured required for the dimension measurement are stored in the database 205 via the input and output apparatus 206 (steps S102 and S103). The magnification of the input image is determined by a name of a folder storing the image. For example, if the magnification is 100 k times, the folder name is assumed to be 100 k. Magnification information of each image is stored in the database 205. The central processing unit 201 passes the models and parameters from the database 205 to the model estimation unit 203, passes the input test image, and performs estimation by the model estimation unit 203 (step S105), and obtains a bounding box coordinate that is a pattern detection result and a semantic segmentation image (step S106).

Next, in the measurement step, the central processing unit 201 passes the bounding box coordinate and the semantic segmentation image to the dimension measurement unit 204, and obtains coordinates of a boundary line based on the semantic segmentation image. Next, the boundary line coordinate is divided for each pattern, coordinates of feature points are obtained by calling the feature point definition stored in the database 205, and main dimensions are calculated by calling the dimension definition (step S107). Since the unit of the obtained dimension is the number of pixels, it is converted to an actual dimension (step S108) calling the magnification stored in the database 205. A measured dimension value is output to the input and output apparatus 206, and boundary line coordinate data for each pattern is stored in the database 205 (step S109).

Further, when a dimension measurement point is to be newly added, the definition 209 of the new feature point required for dimension measurement and definition 209 of the new dimension are input from the input and output apparatus 206 and stored in the database 205 (steps S110 and S111).

Next, it is determined whether or not a new dimension measurement point is designated (step S112), and if there is no designation, the dimension measurement processing is skipped. If there is a designation, coordinate data of the boundary line for each pattern stored in the database 205 is read out to calculate the dimension (step S114), and after scale conversion to the actual dimension (step S115), a measured dimension value is output to the input and output apparatus 206 (step S116).

Here, when it is desired to search for a processing shape, a goal dimension value is input (step S117). The central processing unit 201 determines whether or not a shape search is designated (step S118). If there is no designation, the central processing unit 201 ends the dimension measurement processing (step S119). If there is a designation, all dimension values of the image stored in the database 205 are searched (step S120), and a shape close to the input dimension is output to the input and output apparatus 206 (step S121). Thus, the processing ends (step S122).

FIG. 7 is a flowchart of determining an optimal processing condition of the processing apparatus 111 based on a goal processed result (a goal output parameter value) executed by the processing condition searching apparatus 100 in the semiconductor manufacturing system 10.

First, regarding the processing performed by the processing apparatus 111, a goal processed result (a goal output parameter value) as a target and the input parameter 101 selected as a parameter for controlling the processing apparatus 111 are transferred from the input apparatus 103 to the central processing unit 104 (step S200).

Next, the central processing unit 104 stores the received goal output parameter value and the selected input parameter (the processing condition parameter) in the database 105, and passes the selected input parameter to the initial processing condition setting unit 106. The initial processing condition setting unit 106 reads data of a settable range of the input parameter from the database 105 based on the passed input parameter, and automatically sets an initial processing condition (step S201). The central processing unit 104 stores the set initial processing condition in the database 105, and passes the initial processing condition to the apparatus control device 110.

The apparatus control device 110 transfers the initial processing condition to the processing apparatus 111. Alternatively, the user may input the initial processing condition output by the apparatus control device 110 to the processing apparatus 111. The processing apparatus 111 performs processing in accordance with the input initial condition, the evaluation apparatus 112 performs evaluation, and the cross-sectional image 208 which is an evaluated result is passed to the dimension measurement apparatus 200 via the input and output apparatus 206. The dimension value (the initial output parameter value) obtained by the dimension measurement apparatus 200 is input to the input apparatus 103 via the input and output apparatus 206. The central processing unit 104 receives an initial processed result from the input apparatus 103 (step S202). The central processing unit 104 passes the initial processing condition and the initial processed result to the convergence determination unit 113.

The convergence determination unit 113 compares the initial processed result with the goal processed result and determines whether or not the initial processed result converges to the goal processed result within predetermined accuracy (step S203). If converging, the initial processing condition converging to the goal processed result is passed to the output apparatus 114, and the output apparatus 114 outputs the initial processing condition as the optimal processing condition 102 (step S210).

The convergence of the output parameter value (the processed result) can be determined using a sum of squares of an error between the goal output parameter value and the output parameter value for all output parameters to be used, which is given by Formula 1.

[Math 1]

$$\Sigma_{i=1}^{NP}(x_i-y_i)^2 \cdot W_i \qquad \text{(Formula 1)}$$

Here, NP is a total number of the output parameters used, $x_i$ is an i-th goal output parameter value, $y_i$ is an i-th output parameter value (actual value), and $W_i$ is a weight designated by the user for each output parameter.

On the other hand, if not converging, an instruction to continue processing is sent from the convergence determination unit 113 to the central processing unit 104, and the central processing unit 104 creates initial learning data including the initial processing condition (the initial input parameter value) and the initial processed result (the initial output parameter value) in the database 105 (step S204).

Next, the central processing unit 104 reads the goal output parameter value (the goal processed result) and the initial learning data from the database 105 and passes them to the target setting unit 107. The target setting unit 107 sets a target processed result (a target output parameter value) (step S205). The set target output parameter value is passed to the central processing unit 104 and stored in the database 105. The target setting unit 107 selects best data (output parameter value (actual value)) closest to the goal output parameter value from the existing learning data, and sets the target output parameter value by interpolating between the best output parameter value and the goal output parameter value at that time. Although the number of targets to be set may be any number as long as it is one or more, it is desirable to set a plurality of, for example, about 4 to 5 targets in consideration of efficiency.

Next, the central processing unit 104 reads the initial learning data from the database 105 and sends the initial learning data to the model learning unit 108. The model learning unit 108 learns a prediction model that relates to the input parameter value (the processing condition) and the output parameter value (the processed result) (step S206). As the prediction model, a neural network, a support vector machine, a kernel method, or the like can be used. The learned prediction model is passed to the processing condition searching unit 109.

Next, the processing condition searching unit 109 uses the prediction model passed from the model learning unit 108 and a constraint on the input parameter read from the database 105 to search for a processing condition for a target output parameter value and the target output parameter value read from the database 105 (step S207). Since in the prediction model, the processing condition is input and the processed result is output, in order to reversely determine the processing condition from the processed result, various optimal solution searching methods such as a simulated annealing method and a genetic algorithm can be used. The processing condition searching unit 109 passes the searched processing condition (the target input parameter value) to the apparatus control device 110, and stores the processing condition in the database 105 via the central processing unit 104.

The apparatus control device 110 transfers the passed processing condition (target input parameter value) to the processing apparatus 111. Alternatively, the user may input the processing condition output by the apparatus control device 110 to the processing apparatus 111. The processing apparatus 111 performs processing in accordance with the input initial condition, performs evaluation by the evaluation apparatus 112, and passes the cross-sectional image 208 which is the evaluation result to the dimension measurement apparatus 200 via the input and output apparatus 206. The dimension value (the target output parameter value) obtained by the dimension measurement apparatus 200 is input to the input apparatus 103 via the input and output apparatus 206. The central processing unit 104 receives the processed result (the target output parameter value) from the input apparatus 103 (step S208). The central processing unit 104 passes the processing condition (the target input parameter value) and the processed result (the target output parameter value) to the convergence determination unit 113.

The convergence determination unit 113 compares the processed result (the output parameter value (actual value)) with the goal processed result (the goal output parameter value), and determines whether or not the processed result converges to the goal processed result within predetermined accuracy (step S209). If converging, the processing condition converging to the goal processed result is passed to the output apparatus 114, and the output apparatus 114 outputs the initial processing condition as the optimal processing condition 102 (step S210).

On the other hand, if not converging, an instruction to continue processing is sent from the convergence determination unit 113 to the central processing unit 104, the central processing unit 104 adds a set of the processing condition (the input parameter value) and the processed result (the output parameter value (actual value)) for a newly searched goal processed result and the target processed result to the learning data set of the database 105 as additional learning data, so that the learning data set is updated (step S204).

Hereinafter, the estimation process from creation and update of the learning data set (step S204) to convergence determination (step S209) is repeated until the processed result converges to the goal processed result. In this way, the optimal processing condition for implementing the goal processed result is searched autonomously.

The processing flow of the entire semiconductor manufacturing system 10 including the processing condition searching apparatus 100 and the dimension measurement apparatus 200 is described above.

Hereinafter, a case where the processing apparatus 111 is an etching apparatus will be described as an example.

FIG. 8 shows an example of a cross-sectional SEM image that is input data set in the learning data set. A size of the image is 1280×960 pixels. The sample is a trench structure in which unit patterns of line/space are repeated, and includes three regions of a background 300, a mask 301, and a substrate 302.

FIG. 9 shows an example of dimension measurement points. In this example, the dimension measurement points include five parts of (1) L1: a mask upper surface width 305, (2) L2: a mask/substrate interface width 306, (3) L3: a substrate narrowest portion width 307, (4) L4: a mask height 308, and (5) L5: a trench depth 309. The mask upper surface width 305 is defined as an interval between two peak positions having a convex shape. When the shape has only one peak position, the width is set to 0. Seven points A to G in the figure are feature points on a boundary line used for dimension measurement, and points that can be uniquely defined only from boundary line data are used. For example, A and B are peak points on the mask upper surface. The definition of the feature points A to G and the correspondence between the dimensions L1 to L5 and the feature points A to G (L1: A, B, L2: C, D, etc.) are input by the user via the input and output apparatus 206 and stored in the database 205. Specifically, a script describing the definition of the feature points and the dimension is stored. The number and positions of the feature points and the measurement dimensions are appropriately set according to the structure of the measurement target.

FIG. 10 is a diagram illustrating the definition of coordinates of the bounding box described in annotation data to be given to the object detection model among the annotation data which is the output data set in the learning data set. A label name "pattern" is defined for a region formed by a mask and a part of the substrate, which is a unit structure of line/space repetition surrounded by a frame (a bounding box) shown in the drawing. In this example, the label has only one type, and the label number is 0. There are five patterns in FIG. 10. Coordinates of bounding boxes have an origin at the upper left of the image, an X axis in a horizontal direction, and a Y axis in a vertical direction. A boundary in the Y axis direction of the bounding boxes is set to positions respectively with a margin of several pixels so that a mask upper portion and a trench bottom are completely included. Since the bounding box is rectangular, two coordinates on the upper left and the lower right may be given to specify the position.

FIG. 11 is an excerpt of a description example of the annotation data corresponding to FIG. 10. Only necessary items are extracted. Although data is described in an xml format in this example, any format assumed by the object detection model used may be used. A name of a folder storing an image file is described in tags <folder> to </folder>, and an image file name is described in tags <filename> to </filename>. Tags <object> to </object> are locations where information related to the bounding box is described, and are repeated by the number of bounding boxes included in the image. Tags <name> to </name> in the tags <object> to </object> form a location where a label name is designated. Four numerical values described in tags <bndbox> to </bndbox> are coordinates of the upper left and the lower right points of a first bounding box. Annotation data can be created manually or created using a learned object detection model.

FIG. 12 shows an example of the annotation data for a semantic segmentation model among the annotation data that is an output data set in the learning data set. The annotation data can be created manually using dedicated software, or can be created using the learned semantic segmentation model. The data is an image color-coded for each region. Here, the region includes each layer constituting a cross section of the semiconductor device to be measured and a background other than the cross section of the semiconductor device. This example includes three regions of a background 310, a mask 311 and a substrate 312 as each layer constituting the cross section of the semiconductor device. The label names of the three regions are "background", "mask", and "substrate", and the colors are black, gray, and white.

FIG. 13 shows a correspondence among the label name, the label number, and the color, and is stored in the database 205. Although the label number and the color given to each label are arbitrary, it is necessary to fix the label number and the color in the dimension measurement apparatus 200.

FIG. 14 shows an example of a GUI screen displayed on the input and output apparatus 206 when performing the learning step. The screen includes an input data window 323, an annotation data window 331, and a terminal window 339. In the input data window 323, a folder in which the input data set of the learning data set is stored is selected by a load button 320. An image file to be displayed in the input data window 323 is selected by a select button 321. A display result is cleared by a clear button 322. The selected folder name and file name are displayed in cells 324 and 325. The selected image is displayed in an image window 326.

In the annotation data window 331, any one of the semantic segmentation model or the object detection model is selected by a model button 328. The type of data displayed in the annotation data window 331 changes according to the selected model. The folder including the annotation data is also automatically selected according to the selected model. FIG. 14 shows an example of a case where the semantic segmentation model is selected. A sample to be displayed in a window 334 is designated by a select button 329. A folder name and a file name of the selected sample are displayed in cells 332 and 333. An annotation image is displayed in the window 334, and a correspondence table of a label name, a label number, and a color is displayed in a table 335.

In the terminal window 339, learning of the model selected by the model button 328 is started by a start button 336. In the terminal window 339, a progress of the calculation and a final result are displayed as messages. A stop button 337 can be used to stop the calculation even in progress. A learned model, which is a calculation result, is automatically saved.

FIG. 15 shows an example of a test image whose dimension is to be measured. As described above, a contour of an unnecessary deep structure is shown in the test image. This structure is to be ignored at the time of dimension measurement.

FIG. 16 shows a result obtained by inputting the test image shown in FIG. 15 into the learned object detection model and performing the prediction. Together with the label names of the detected objects, bounding box coordinates are indicated by black frames. In the example of FIG. 16, four patterns are detected.

FIG. 17 shows coordinate value data of the bounding boxes corresponding to FIG. 16, and is automatically stored in the database 205 after prediction.

FIG. 18 shows a result obtained by inputting the test image shown in FIG. 15 into the learned semantic segmentation model and performing the prediction. The color of each region follows the correspondence set in FIG. 13, that is, the background is black, the mask is gray, and the substrate is white.

Since the coordinates of the boundary lines of the regions are obtained from FIG. 18, the boundary line coordinates are cut out for each bounding box using the coordinate values of the bounding boxes in FIG. 17. Coordinates of the feature points A to G necessary for dimension measurement are obtained based on the cut-out boundary line coordinates of each bounding box, and the dimensions L1 to L5 are obtained. In this way, the dimension is automatically measured for each pattern based on the input image.

FIG. 19 shows an example in which the measured dimension values are displayed on the original input image, and the detected bounding box positions are also shown as rectangles.

FIG. 20 shows measurement results of FIG. 19. In the five dimensions L1 to L5, statistical values (average value, standard deviation) are also calculated and displayed in addition to the values for each pattern. The results are automatically stored in the database 205, and the average values are output to the input and output apparatus 206.

FIG. 21 shows an example of a GUI screen displayed on the input and output apparatus 206 when performing the prediction and the measurement steps. The screen includes an input data window 345 and a prediction and measurement result window 353. In the input data window 345, a script defining a correspondence between the feature points and the dimension is loaded by a define button 340. The loaded definition is displayed in a definition table 349. Next, it is selected whether to perform prediction and measurement by selecting test images one by one by a manual button 341 or to designate a folder including the test images and perform prediction and measurement for all images in the folder at once by a batch button 342. By making the folder name match the magnification of the image, information on the magnification can be obtained from the folder name. The selected folder name and file name are displayed in cells 346 and 347, respectively. The selected test image is displayed in an image window 350. When the batch is selected, the file name and the image of a first test image are displayed in the cell 347 and the image window 350, respectively. Prediction and dimension measurement are performed using two learned models by a start button 343. A calculation result is automatically saved. A display result is cleared by a clear button 344.

In the prediction and measurement result window 353, an original image whose result is to be displayed is selected by a load button 351. The folder name and the file name of the selected image are displayed in cells 354 and 355, respectively. A semantic segmentation result is displayed in a window 356, and an object detection result is displayed in a window 357. In a final result window 358, an image in which a dimension value is displayed on the original image is displayed, and measured dimension values and their statistical values are displayed in a numerical table 359.

FIG. 22 shows an example of a GUI screen displayed on the input and output apparatus 206 when performing a searching step of searching for a shape close to a desired dimension from the database 205, and includes a target window 360 and a searching result window 363. In the target window 360, a target dimension value is input to a target structure cell 361. Definitions of dimensions L1 to L5 are illustrated in a definition window 362.

In the searching result window 363, the search is executed by a search button 364. Searching results are sorted and displayed in ascending order of error, and a folder name 366, a file name 367, an image 368 describing a dimension value, and a dimension average value 369 are displayed.

Second Embodiment

In the first embodiment, although the semantic segmentation model is used as the first image recognition model and the object detection model is used as the second image recognition model, the dimension measurement method is not limited to this combination. As the second embodiment, a method using two types of semantic segmentation models will be described. In the second embodiment, a first semantic segmentation model for detecting a contour line and a second semantic segmentation model for detecting a feature point are used. In the second embodiment, feature point extraction using an image recognition model will be mainly described, and the description of the same points as those in the first embodiment will be omitted.

FIG. 23 is a flowchart of measuring a dimension based on an image input through a preliminary learning step executed by the dimension measurement apparatus 200.

First, the feature point 209 necessary for dimension measurement is defined and stored in the database 205 via the input and output apparatus 206 (step S300). This processing is done before a learning step.

Next, for the first semantic segmentation model (the first image recognition model), an annotation image that is divided into a contour line and other regions is created, and for the second semantic segmentation model (the second image recognition model), an annotation image that is divided into feature points necessary for dimension measurement and other regions is created, and the images are input from the input and output apparatus 206 (step S302).

Next, the central processing unit 201 passes the learning data set to the model learning unit 202, and the model learning unit 202 performs learning of the models (step S303). In the following description, a case in which a neural network having a convolutional layer is used as the models will be described, and a machine learning model such as a decision tree may also be used.

Next, a test image whose dimension is to be measured is read from the evaluation apparatus 112 (step S304). The central processing unit 201 passes this image to the model learning unit 202, the model estimation unit 203 performs estimation (step S305) and obtains two types of semantic segmentation images (step S306).

Next, the correspondence relationship 209 between feature points and dimension measurement points is input from the input and output apparatus 206 and stored in the database 205 (step S301).

Next, the dimension measurement unit 204 obtains feature point coordinates on the contour line based on the two types of semantic segmentation images, calculates main dimensions, and obtains coordinate data of the entire contour line (step S307). Subsequently, the obtained dimensions are converted into actual dimensions (step S308). The measured dimension values are output to the input and output apparatus 206, and the coordinate data of the contour line is stored in the database 205 (step S309).

Further, when it is desired to compare processed shapes, two samples to be compared are designated (step S310). Subsequently, it is determined whether or not there is a designation of shape comparison (step S311). If there is no designation, the dimension measurement processing is ended (step S312). If there is a designation, the contour line data and the dimension values stored in the database 205 are loaded, and the comparison result is output to the input and output apparatus 206 (step S313). Thus, the processing is ended (step S314).

Hereinafter, a case where the processing apparatus 111 is an etching apparatus will be described as an example. FIG. 24 is an example of annotation data that teaches a contour line corresponding to an input data image of the learning data set of FIG. 8. The annotation data consists of two regions of a background 400 and a contour line 401. Their label names are "background" and "contour", and their label numbers are 0 and 1. FIG. 25 is a correspondence among a label name, a label number, and a color. Although the label number and the color given to each label are arbitrary, it is necessary to fix the label number and the color in the dimension measurement apparatus 200.

FIG. 26 is an example of annotation data that teaches positions of feature points corresponding to the input data image of the learning data set of FIG. 8. Among the seven points A to G shown in FIG. 9 as the feature points, four points A 411, C 412, E 413, and G 414 are set as labels and therefore FIG. 26 is an image color-coded for each of the five labels including the background 410. Since other three feature points B, D, and F are obtained from A, C, and E assuming horizontal symmetry, the three feature points B, D, and F are not included in the label. As described below, by obtaining the feature points B, D, F based on the feature points A, C, and E and the contour line, it is possible to ensure that the feature points B, D, and F and the feature points A, C, and E are feature points for one unit pattern without visual observation. FIG. 27 is a correspondence among a label name, a label number, and a color. Although the label number and the color given to each label are arbitrary, it is necessary to fix the label number and the color in the dimension measurement apparatus 200.

FIG. 28 shows an example of a GUI screen displayed on the input and output apparatus 206 when performing the learning step. The screen includes the input data window 323, the annotation data window 331, and the terminal window 339. In the input data window 323, a folder in which an input image file is stored is selected by the load button 320. An image file to be displayed is selected by the select button 321. A display result is cleared by the clear button 322. The selected folder name and file name are displayed in the cells 324 and 325. The selected image is displayed in the image window 326.

In the annotation data window 331, any one of the semantic segmentation model for the contour line (the first semantic segmentation model) or the semantic segmentation model for feature points (the second semantic segmentation model) is selected by a model button 415. The type of data displayed in the annotation data window 331 changes according to the selected model. The folder including the annotation data is also automatically selected according to the selected model. FIG. 28 shows an example of a case where the semantic segmentation model for the contour line is selected. A sample to be displayed in the window is designated by the select button 329. A folder name and a file name of the selected sample are displayed in cells 324 and 325, respectively. An annotation image is displayed in the window 334, and a correspondence table of a label name, a label number, and a color is displayed in the table 335.

In the terminal window 339, learning of the model selected by the model button 415 is started by the start button 336. In the terminal window 339, a progress of the calculation and a final result are displayed as messages. The stop button 337 can be used to stop the calculation even in progress. A model parameter, which is a calculation result, is automatically stored.

FIG. 29 is an image of the detection result of the contour line obtained by inputting the test image shown in FIG. 15 into the first learned semantic segmentation model and performing the prediction. At the same time, the coordinates of the contour line are obtained.

FIG. 30 is an image of the detection results of the feature points A, C, E, and G obtained by inputting the test image shown in FIG. 15 into the second learned semantic segmentation model and performing the prediction. At the same time, the coordinates of the these feature points are also obtained. Since the coordinates of the feature points are not necessarily located on the contour line obtained in FIG. 29, points on the contour line in FIG. 29 closest to the feature point coordinates obtained in FIG. 30 are adopted as the feature point coordinates.

FIG. 31 is a diagram illustrating a method of obtaining the corresponding feature points B, D, and F from the feature points A, C, and E. A corresponding point is a point having the same Y coordinate as an original point and a smallest difference in X coordinate, that is, a point on a right nearest contour line. In the first embodiment, the boundary line coordinates are divided for each pattern. In the second embodiment, since the coordinates of two points serving as a pair are known, the division is not necessary. By the coordinates of the obtained seven feature points and the definition of the feature points and dimensions called from the database 205, a predetermined dimension is calculated. In this way, the dimension is automatically measured from the input image.

FIG. 32 shows an example of a GUI screen displayed on the input and output apparatus 206 when performing the prediction and measurement steps. The screen includes the input data window 345 and the prediction and measurement result window 353. In the input data window 345, a script defining a correspondence between the feature point and the dimension is selected and loaded by the define button 340. The loaded definition is displayed in the definition table 349. Next, it is selected whether to perform prediction and measurement by selecting the test images one by one by the manual button 341 or to designate a folder including the test images and perform prediction and measurement for all images in the folder at once by the batch button 342. By making the folder name match the magnification of the image, information on the magnification can be obtained from the folder name. The selected folder name and file name are displayed in the cells 346 and 347. The selected test image is displayed in the image window 350. When the batch is selected, the file name and the image of a first test image are displayed in the cell 347 and the image window 350, respectively. Prediction and dimension measurement are performed using two learned models by the start button 343. A calculation result is automatically saved. A display result is cleared by the clear button 344.

In the prediction and measurement result window 353, an original image whose result is to be displayed is selected by the load button 351. The folder name and the file name of the selected image are displayed in the cells 354 and 355, respectively. The semantic segmentation result for the contour line is displayed on a window 416, and the semantic segmentation result for the feature point is displayed on a window 417. In the final result window 358, an image in which a dimension value is displayed on the original image is displayed, and measured dimension values and statistical values are displayed in the numerical table 359.

FIG. 33 shows an example of a GUI screen displayed on the input and output apparatus 206 when a comparison step of comparing shapes of two images is performed. The screen includes an input data window 423 and a comparison result window 436. In the input data window 423, a first image to be compared is selected by a load 1 button 420, and a second image to be compared is selected by a load 2 button 421. The folder name and the file name of the selected first image are displayed in cells 424 and 425, respectively, and the folder name and file name of the selected second image are displayed in cells 426 and 427, respectively. The two selected images are displayed in image windows 428 and 429. Contour line images extracted for the two selected images are loaded from the database 205 and displayed in contour line windows 430 and 431.

The comparison result window 436 displays a window 437 in which contour lines are superimposed, and a table 438 showing an average value of the dimension values of the two images and a difference thereof. An auto button 432 is a button for automatically adjusting the two contour lines 430 and 431 so that the mask upper surfaces match in the vertical direction and centers of the trenches match in the horizontal direction. When the automatic adjustment fails or is desired to be manually adjusted, the user presses a manual button 433, and the user drags the image with a mouse to adjust the position. In the table 438, the dimension values measured for the two images are loaded from the database 205, and the differences therebetween are calculated and displayed. The superimposed contour line image and the numerical value of the table are stored in the database 205 by a save button 434.

It should be noted that the invention is not limited to the above-described embodiments and includes various modifications and equivalent configurations within the spirit of the claims. For example, the above-described embodiments have been described in detail in order to make the invention easy to understand, and the invention is not necessarily limited to those have all the configurations described. In addition, apart of a configuration of a certain embodiment may be replaced with a configuration of another embodiment. In addition, a configuration of another embodiment may be added to a configuration of a certain embodiment. Further, another configuration may be added to, subtracted from or replaced with a part of a configuration of each embodiment. For example, in the first embodiment, the semantic segmentation model has been described as an example of outputting an image in which each layer constituting the cross section of the semiconductor device is color-coded as a region. However, like the second embodiment, the semantic segmentation model that outputs feature points may be used. However, in this case, it is necessary to output all the feature points (the feature points A to G in the example of the second embodiment) unlike the example of the second embodiment.

In addition, a part or all of the configurations, functions, processing units, processing methods and the like may be realized by hardware, for example, by designing with an integrated circuit, or may be realized by software, with a processor interpreting and executing a program that implements each function. Information such as a program, a table, and a file that implements each function can be stored in a storage device such as a memory, a hard disk, and a Solid State Drive (SSD), or a recording medium such as an Integrated Circuit (IC) card, an SD card, and a Digital Versatile Disc (DVD).

In addition, control lines and information lines that are considered to be necessary for the description are shown, and not all the control lines and information lines that are necessary for mounting are shown. It may be considered that almost all the configurations are actually connected to each other.

REFERENCE SIGN LIST 10 semiconductor manufacturing system
20, 30 neural network model
100 processing condition searching apparatus
101 target processed result and parameter selection
102 optimal processing condition
103 input apparatus
104 central processing unit
105 database
106 initial processing condition setting unit
107 target setting unit
108 model learning unit
109 processing condition searching unit
110 apparatus control device
111 processing apparatus
112 evaluation apparatus
113 convergence determination unit
114 output apparatus
115 interface
116 processor
117 ROM
118 RAM
200 dimension measurement apparatus
201 central processing unit
202 model learning unit
203 model estimation unit
204 dimension measurement unit
205 database
206 input and output apparatus
208 cross-sectional image
209 feature point and dimension definition, magnification, and learning data set
300 background
301 mask
302 substrate
305 mask upper surface width
306 mask/substrate interface width
307 substrate narrowest portion width
308 mask height
309 trench depth
310 background
311 mask
312 substrate
320 load button
321 select button
322 clear button
323 input data window
324, 325 cell
326 image window
328 model button
329 select button
330 clear button
332, 333 cell
334 window
335 table
336 start button
337 stop button
338 clear button
339 terminal window
340 define button
341 manual button
342 batch button
343 start button
344 clear button
345 input data window
346, 347 cell
349 definition table
350 image window
351 load button
352 clear button
353 prediction and measurement result window
354, 355 cell
356, 357 window
358 final result window
359 numerical table
360 target window
361 target structure cell
362 definition window
363 searching result window
364 search button
365 clear button
366 folder name
367 file name
368 image
369 dimension average value
400 background
401 contour line
410 background
411 feature point A
412 feature point C
413 feature point E
414 feature point G
415 model button
416, 417 window
420 load 1 button
421 load 2 button
422 clear button
423 input data window
424, 425, 426, 427 cell
428, 429 image window
430, 431 contour line window
432 auto button
433 manual button
434 save button
435 clear button
436 comparison result window
437 window
438 table

The invention claimed is:

1. A dimension measurement apparatus that measures a dimension of a semiconductor device having a repetitive pattern based on a cross-sectional image of the semiconductor device, the dimension measurement apparatus comprising:
a processor;
a memory; and
a dimension measurement program that is stored in the memory and measures the dimension of the semiconductor device by being executed by the processor, wherein
the dimension measurement program includes a model estimation unit and a dimension measurement unit,
the model estimation unit outputs, by a first image recognition model, a labeled image in which the cross-sectional image is labeled for each of a plurality of unit patterns, each said unit pattern being repeated in each region, and outputs, by a second image recognition model, coordinates where each of the plurality of unit patterns constituting the repetitive pattern are respectively located in the cross-sectional image, and the dimension measurement unit obtains coordinates of a plurality of feature points, said plurality of feature points being defined in advance for each of the plurality of unit patterns using the labeled image and the coordinates where each of the unit patterns are located, and measures a dimension defined as a distance between two predetermined points among the plurality of feature points.

2. The dimension measurement apparatus according to claim 1, wherein a region where the first image recognition model labels the cross-sectional image includes each layer constituting a cross section of the semiconductor device and a background other than the cross section of the semiconductor device, and the model estimation unit obtains coordinates of a region boundary line between regions from the labeled image, obtains the coordinates of the plurality of feature points from the coordinates of the region boundary line and the coordinates where the unit patterns are located.

3. The dimension measurement apparatus according to claim 2, wherein the dimension measurement program includes a model learning unit, and the model learning unit learns the first image recognition model by first learning data in which the cross-sectional image of the semiconductor device is input data and the labeled image obtained by labeling the cross-sectional image as the input data for each region is output data, and learns the second image recognition model by second learning data in which the cross-sectional image of the semiconductor device is input data and the coordinates where the unit patterns are located in the cross-sectional image as the input data are output data.

4. The dimension measurement apparatus according to claim 3, wherein the first image recognition model is a semantic segmentation model and the second image recognition model is an object detection model.

5. The dimension measurement apparatus according to claim 4, wherein the first image recognition model is a learning model including a parameter learned using teacher data, in which a luminance value of a pixel of the cross-sectional image of the semiconductor device is input data and a label number defined corresponding to a region to which the pixel of the cross-sectional image corresponding to the input data belongs is output data, in an intermediate layer, and the second image recognition model is a learning model including a parameter learned using teacher data, in which a luminance value of a pixel of the cross-sectional image of the semiconductor device is input data and a label number of an object included in the cross-sectional image corresponding to the input data and coordinates where the object is located are output data, in an intermediate layer.

6. The dimension measurement apparatus according to claim 1, wherein the cross-sectional image is one of a cross-sectional SEM image and a TEM image.

7. The dimension measurement apparatus according to claim 1, wherein the dimension measurement unit stores a measured dimension of the semiconductor device in a database, and, when a target dimension value for the semiconductor device is input, searches the database for a cross-sectional image having a dimension that is close to the target dimension value.

8. A semiconductor manufacturing system comprising:

the dimension measurement apparatus according to claim 1;

a processing apparatus that performs processing to the semiconductor device; and a processing condition searching apparatus that searches for an optimal processing condition of processing the semiconductor device by the processing apparatus, wherein the dimension measurement apparatus measures a dimension of the semiconductor device obtained by the processing apparatus performing processing under a predetermined processing condition set by the processing condition searching apparatus, and the processing condition searching device outputs, as the optimal processing condition, a processing condition when the dimension of the semiconductor device measured by the dimension measurement apparatus converges to a target value while changing the predetermined processing condition.

9. A dimension measurement apparatus that measures a dimension of a semiconductor device having a repetitive pattern from a cross-sectional image of the semiconductor device, the dimension measurement apparatus comprising:

a processor;

a memory; and a dimension measurement program that is stored in the memory and measures a dimension of the semiconductor device by being executed by the processor, wherein the dimension measurement program includes a model estimation unit and a dimension measurement unit, the model estimation unit outputs, by a first image recognition model, a first labeled image in which the cross-sectional image includes a first plurality of labeled points on a contour line and a background, and outputs, by a second image recognition model, a second labeled image in which the cross-sectional image includes a second plurality of labeled points in the background and a first plurality of feature points which include said first plurality of labeled points on the contour line, said first plurality of feature points defining one of a plurality of unit patterns constituting the repetitive pattern, and the dimension measurement unit uses coordinates of the contour line from the first labeled image and coordinates of the first plurality of feature points from the second labeled image to obtain a second plurality of feature points on the contour line, and measures a dimension defined as a distance between a predetermined point of the first plurality of feature points and a predetermined point of the second plurality of feature points.

10. The dimension measurement apparatus according to claim 9, wherein the unit pattern in the cross-sectional image has a shape that can be assumed symmetry, and the dimension measurement unit obtains coordinates of the second plurality of feature points from the coordinates of the first plurality of feature points based on the symmetry.

11. The dimension measurement apparatus according to claim 9, wherein the dimension measurement program includes a model learning unit, the model learning unit learns the first image recognition model by first learning data in which the cross-sectional image of the semiconductor device is input data and a labeled image obtained by labeling the cross-sectional image, which is the input data, separately into the contour line and the background is output data, and learns the second image recognition model by second learning data in which the cross-sectional image of the semiconductor device is input data and a labeled image obtained by labeling the cross-sectional image, which is the input data, separately into the first plurality of feature points and the background is output data.

12. The dimension measurement apparatus according to claim 11, wherein the first image recognition model and the second image recognition model are semantic segmentation models.

13. The dimension measurement apparatus according to claim 12, wherein the first image recognition model is a learning model including a parameter learned using teacher data, in which a luminance value of a pixel of the cross-sectional image of the semiconductor device is input data and a label number defined according to whether the pixel of the cross-sectional image corresponding to the input data is the contour line or the background is output data, in an intermediate layer, and the second image recognition model is a learning model including a parameter learned using teacher data, in which a luminance value of a pixel of the cross-sectional image of the semiconductor device is input data and a label number defined according to whether the pixel of the cross-sectional image corresponding to the input data is the first plurality of feature points or the background is output data, in an intermediate layer.

14. The dimension measurement apparatus according to claim 9, wherein the cross-sectional image is a cross-sectional SEM image or a TEM image.

15. The dimension measurement apparatus according to claim 9, wherein the dimension measurement unit saves the coordinates of the contour line from the first labeled image and the measured dimension of the semiconductor device in a database, and, when two cross-sectional images are designated, displays contour lines of the two designated cross-sectional images in a superimposed manner, and displays a difference between dimensions of the semiconductor device corresponding to the two designated cross-sectional images.

16. A semiconductor manufacturing system comprising:

the dimension measurement apparatus according to claim 9;

a processing apparatus that performs processing to the semiconductor device; and a processing condition searching apparatus that searches for an optimal processing condition of processing the semiconductor device by the processing apparatus, wherein the dimension measurement apparatus measures a dimension of the semiconductor device obtained by the processing apparatus performing processing under a predetermined processing condition set by the processing condition searching apparatus, and the processing condition searching device outputs, as the optimal processing condition, a processing condition when the dimension of the semiconductor device measured by the dimension measurement apparatus converges to a target value while changing the predetermined processing condition.

17. A dimension measurement program that causes a computer to execute processing of measuring a dimension of a semiconductor device having a repetitive pattern from a cross-sectional image of the semiconductor device, the dimension measurement program comprising:

a first step of outputting, by a first image recognition model, a labeled image in which the cross-sectional image is labeled for each region of a plurality of regions, each said region including one of a plurality of unit patterns located therein;

a second step of outputting, by a second image recognition model, coordinates where the plurality of unit patterns constituting the repetitive pattern are respectively located in the cross-sectional image; and a third step of using the labeled image and the coordinates where each of the unit patterns is located to obtain coordinates of a plurality of feature points defined in advance for each of the unit patterns, and measuring a dimension defined as a distance between two predetermined points among the plurality of feature points.

18. The dimension measurement program according to claim 17, prior to the first to third steps, further comprising:

a fourth step of learning the first image recognition model by first learning data in which the cross-sectional image of the semiconductor device is input data and a labeled image labeled in a region of the cross-sectional image as the input data is output data; and a fifth step of learning the second image recognition model by second learning data in which the cross-sectional image of the semiconductor device is input data and coordinates where the unit patterns are located in the cross-sectional image as the input data are output data.

19. A dimension measurement program that causes a computer to execute processing of measuring a dimension of a semiconductor device having a repetitive pattern from a cross-sectional image of the semiconductor device, the dimension measurement program comprising:

a first step of outputting, by a first image recognition model, a first labeled image in which the cross-sectional image is labeled in a contour line and a background;

a second step of outputting, by a second image recognition model, a second labeled image in which the cross-sectional image is labeled in a background and a first plurality of feature points defined for each of a plurality of unit patterns constituting the repetitive pattern; and a third step of using coordinates of the contour line from the first labeled image and coordinates of a first plurality of feature points from the second labeled image to obtain coordinates of a second plurality of feature points, and measuring a dimension defined as a distance between a predetermined point of the first plurality of feature points and a predetermined point of the second plurality of feature points.

20. The dimension measurement program according to claim 19, prior to the first to third steps, further comprising:

a fourth step of learning the first image recognition model by first learning data in which the cross-sectional image of the semiconductor device is input data and a labeled image obtained by labeling the cross-sectional image, which is the input data, separately into the contour line and the background is output data; and a fifth step of learning the second image recognition model by second learning data in which the cross-sectional image of the semiconductor device is input data, and a labeled image obtained by labeling the cross-sectional image, which is the input data, separately into the plurality of feature points and the background is output data.

\* \* \* \* \*